(12) United States Patent
Pinkerton

(10) Patent No.: US 7,414,325 B2
(45) Date of Patent: Aug. 19, 2008

(54) ENERGY CONVERSION SYSTEMS USING NANOMETER SCALE ASSEMBLIES AND METHODS FOR USING SAME

(75) Inventor: Joseph F Pinkerton, Austin, TX (US)

(73) Assignee: Ambient Systems, Inc., Austin, TX (US)

( * ) Notice: Subject to any disclaimer, the term of this patent is extended or adjusted under 35 U.S.C. 154(b) by 0 days.

(21) Appl. No.: 10/322,375

(22) Filed: Dec. 16, 2002

(65) Prior Publication Data
US 2003/0151257 A1   Aug. 14, 2003

Related U.S. Application Data

(63) Continuation of application No. 09/885,367, filed on Jun. 20, 2001, now Pat. No. 6,593,666.

(51) Int. Cl.
*H02P 9/04* (2006.01)
(52) U.S. Cl. .......................... 290/1 R; 310/25
(58) Field of Classification Search ............. 290/1 R; 310/311, 25; 257/415
See application file for complete search history.

(56) References Cited

U.S. PATENT DOCUMENTS

| | | | |
|---|---|---|---|
| 2,979,551 A | 4/1961 | Pack | |
| 3,181,365 A | 5/1965 | Maninger | |
| 3,252,013 A | 5/1966 | Stanton | |
| 3,365,653 A | 1/1968 | Gabor et al. | |
| 3,495,101 A | 2/1970 | Slonneger | |
| 3,500,451 A * | 3/1970 | Yando | 310/330 |
| 3,508,089 A | 4/1970 | Cheshire | |
| 3,609,593 A | 9/1971 | Boll et al. | |
| 4,152,537 A | 5/1979 | Hansch | |
| 4,387,318 A * | 6/1983 | Kolm et al. | 310/330 |
| 4,536,674 A | 8/1985 | Schmidt | |

(Continued)

FOREIGN PATENT DOCUMENTS

DE   101 23 876   11/2002

(Continued)

OTHER PUBLICATIONS

Fax Transmission Letter from Ropes & Gray of Oct. 19, 2007.*

(Continued)

*Primary Examiner*—Joseph Waks
(74) *Attorney, Agent, or Firm*—Ropes & Gray LLP

(57) ABSTRACT

Energy conversion systems utilizing nanometer scale assemblies are provided that convert the kinetic energy (equivalently, the thermal energy) of working substance molecules into another form of energy that can be used to perform useful work at a macroscopic level. These systems may be used to, for example, produce useful quantities of electric or mechanical energy, heat or cool an external substance or propel an object in a controllable direction. In particular, the present invention includes nanometer scale impact masses that reduce the velocity of working substance molecules that collide with this impact mass by converting some of the kinetic energy of a colliding molecule into kinetic energy of the impact mass. Various devices including, piezoelectric, electromagnetic and electromotive force generators, are used to convert the kinetic energy of the impact mass into electromagnetic, electric or thermal energy. Systems in which the output energy of millions of these devices is efficiently summed together are also disclosed.

29 Claims, 16 Drawing Sheets

U.S. PATENT DOCUMENTS

| | | | |
|---|---|---|---|
| 4,595,864 A | 6/1986 | Stiefelmeyer et al. | |
| 4,814,657 A | 3/1989 | Yano et al. | |
| 4,966,649 A | 10/1990 | Harada et al. | |
| 5,065,085 A | 11/1991 | Aspden et al. | |
| 5,132,934 A | 7/1992 | Quate et al. | |
| 5,216,631 A | 6/1993 | Sliwa, Jr. | |
| 5,578,976 A | 11/1996 | Yao | |
| 5,619,061 A | 4/1997 | Goldsmith et al. | |
| 5,621,258 A | 4/1997 | Stevenson | |
| 5,638,946 A | 6/1997 | Zavracky | |
| 5,649,454 A | 7/1997 | Midha et al. | |
| 5,677,823 A | 10/1997 | Smith | |
| 5,768,192 A | 6/1998 | Eitan | |
| 5,780,727 A | 7/1998 | Gimzewski et al. | |
| 5,835,477 A | 11/1998 | Binnig et al. | |
| 5,964,242 A | 10/1999 | Slocum | |
| 6,011,725 A | 1/2000 | Eitan | |
| 6,054,745 A | 4/2000 | Nakos et al. | |
| 6,069,540 A | 5/2000 | Berenz et al. | |
| 6,073,484 A | 6/2000 | Miller et al. | |
| 6,114,620 A | 9/2000 | Zuppero et al. | |
| 6,123,819 A | 9/2000 | Peeters | |
| 6,127,744 A | 10/2000 | Streeter et al. | |
| 6,127,765 A | 10/2000 | Fushinobu | |
| 6,157,042 A | 12/2000 | Dodd | |
| 6,160,230 A | 12/2000 | McMillan et al. | |
| 6,256,767 B1 | 7/2001 | Kuekes et al. | |
| 6,261,469 B1 | 7/2001 | Zakhidov | |
| 6,300,756 B2 | 10/2001 | Sturm et al. | |
| 6,327,909 B1 | 12/2001 | Hung et al. | |
| 6,424,079 B1* | 7/2002 | Carroll | 310/339 |
| 6,433,543 B1 | 8/2002 | Shahinpoor | |
| 6,445,006 B1 | 9/2002 | Brandes et al. | |
| 6,445,109 B2 | 9/2002 | Perçin et al. | |
| 6,509,605 B1 | 1/2003 | Smith | |
| 6,515,339 B2 | 2/2003 | Shin et al. | |
| 6,528,785 B1 | 3/2003 | Nakayama et al. | |
| 6,548,841 B2 | 4/2003 | Frazier et al. | |
| 6,559,550 B2 | 5/2003 | Herman | |
| 6,574,130 B2 | 6/2003 | Segal et al. | |
| 6,593,666 B1 | 7/2003 | Pinkerton | |
| 6,593,731 B1 | 7/2003 | Roukes et al. | |
| 6,597,048 B1 | 7/2003 | Kan | |
| 6,611,033 B2 | 8/2003 | Hsu et al. | |
| 6,643,165 B2 | 11/2003 | Segal et al. | |
| 6,653,547 B2 | 11/2003 | Akamatsu | |
| 6,669,256 B2 | 12/2003 | Nakayama et al. | |
| 6,672,925 B2 | 1/2004 | Talin et al. | |
| 6,674,932 B1 | 1/2004 | Zhang et al. | |
| 6,685,810 B2 | 2/2004 | Noca et al. | |
| 6,708,491 B1 | 3/2004 | Weaver et al. | |
| 6,730,370 B1 | 5/2004 | Olafsson | |
| 6,756,795 B2* | 6/2004 | Hunt et al. | 324/701 |
| 6,762,116 B1 | 7/2004 | Skidmore | |
| 6,774,533 B2 | 8/2004 | Fujita et al. | |
| 6,803,840 B2 | 10/2004 | Hunt et al. | |
| 6,805,390 B2 | 10/2004 | Nakayama et al. | |
| 6,806,624 B2* | 10/2004 | Lee et al. | 310/339 |
| 6,828,800 B2* | 12/2004 | Reich et al. | 324/658 |
| 6,846,682 B2 | 1/2005 | Heath et al. | |
| 6,848,320 B2 | 2/2005 | Miyajima et al. | |
| 6,882,051 B2 | 4/2005 | Majumdar et al. | |
| 6,911,682 B2 | 6/2005 | Rueckes et al. | |
| 6,914,329 B1 | 7/2005 | Lee et al. | |
| 6,953,977 B2* | 10/2005 | Mlcak et al. | 257/414 |
| 7,071,023 B2 | 7/2006 | Bertin et al. | |
| 7,095,645 B2 | 8/2006 | Pinkerton et al. | |
| 2002/0024099 A1 | 2/2002 | Watanabe et al. | |
| 2002/0039620 A1* | 4/2002 | Shahinpoor et al. | 427/2.12 |
| 2002/0043895 A1* | 4/2002 | Richards et al. | 310/328 |
| 2002/0167374 A1 | 11/2002 | Hunt et al. | |
| 2002/0175408 A1 | 11/2002 | Majumdar et al. | |
| 2002/0180306 A1 | 12/2002 | Hunt et al. | |
| 2003/0033876 A1 | 2/2003 | Roukes et al. | |
| 2003/0036332 A1 | 2/2003 | Talin | |
| 2003/0172726 A1 | 9/2003 | Yasutake et al. | |
| 2003/0175161 A1 | 9/2003 | Gabriel et al. | |
| 2004/0157304 A1 | 8/2004 | Guo | |
| 2004/0239210 A1 | 12/2004 | Pinkerton et al. | |
| 2005/0104085 A1 | 5/2005 | Pinkerton et al. | |
| 2005/0258717 A1 | 11/2005 | Mullen | |
| 2008/0011058 A1* | 1/2008 | Lai et al. | 73/54.23 |

FOREIGN PATENT DOCUMENTS

| | | |
|---|---|---|
| EP | 0977345 | 6/1986 |
| EP | 0518283 | 12/1992 |
| JP | 02004516 | 1/1990 |
| JP | 3074105 | 10/2000 |
| JP | 2001-157470 | 6/2001 |
| WO | WO 01/03208 | 1/2001 |
| WO | WO 0120760 | 3/2001 |
| WO | WO 0193343 | 12/2001 |
| WO | WO 02/080360 | 10/2002 |
| WO | WO 03/001657 | 1/2003 |
| WO | WO 03/021613 | 3/2003 |
| WO | WO 03/078305 | 9/2003 |

OTHER PUBLICATIONS

Halliday et al.; "Physics. Third Edition"; John Wiley & Sons, Inc.; 1978; pp. 529-531.

Dresselhaus et al.; "Carbon Nanotubes: Synthesis, Structure, Properties, and Applications"; Springer-Verlag Berlin Heidelberg 2001; pp. 198-199, 292-293.

Sung et al. "Well-aligned carbon nitride nanotubes synthesized in anodic alumina by electron cyclotron resonance chemical vapor deposition," Applied Physics Letters, vol. 74, No. 2, pp. 197-199, Jan. 11, 1999.

Rueckes et al., "Carbon nanotube-based nonvolatile random access memory for molecular computing," Science, vol. 289 (Jul. 7, 2000), pp. 94-97.

Halg, Beat, "On a micro-electro-mechanical nonvolatile memory cell," IEEE Trans., Electron Devices, vol. 37, No. 10 (Oct. 1990) pp. 2230-2236.

Cleland et al., "Fabrication of High Frequency Nanometer Scale Mechanical Resonators from Bulk Si Crystals," Appl. Phys. Lett., 69 (18), Oct. 28, 1996.

Baughman et al., "Carbon Nanotube Actuators," Science, Issue 5418, vol. 284, pp. 1340-1344, May 21, 1999.

Kinaret J M et al., "A carbon-nanotube-based nanorelay" Applied Physics Letters, American Institute of Physics, New York, USA, vol. 82, No. 8, Feb. 24, 2003, pp. 1287-1289.

White D R et al., "The status of Johnson Noise Thermometry," Metrologia Bur. Int. Poids & Measures, France, vol. 33, 1996, pp. 325-335.

Dequesnes M et al., "Calculation of pull-in voltages for carbon-nanotube-based nanoelectromechanical switches," nanotechnology IOP publishing UK, vol. 13, Jan. 22, 2002, pp. 120-131.

Baughman et al. "Carbon Nanotube Actuators," Science American Association for the Advancement of Science, U.S., vol. 284, May 21, 1999, pp. 1340-1344.

U.S. Appl. No. 60/449,371, filed Feb. 21, 2003, Mullen.

Database Inspec Online!, Institute of Electrical Engineers, Stevenage, GB; Ponomarenko et al. "Properties of boron carbon nanotubes: density-functional-based tight-binding calculations," Database accession No. 7588110, XP002278946, abstract Physical Review B (Condensed Matter and Material Physics), vol. 67, No. 12, pp. 125401-1-5, Mar. 15, 2003.

* cited by examiner

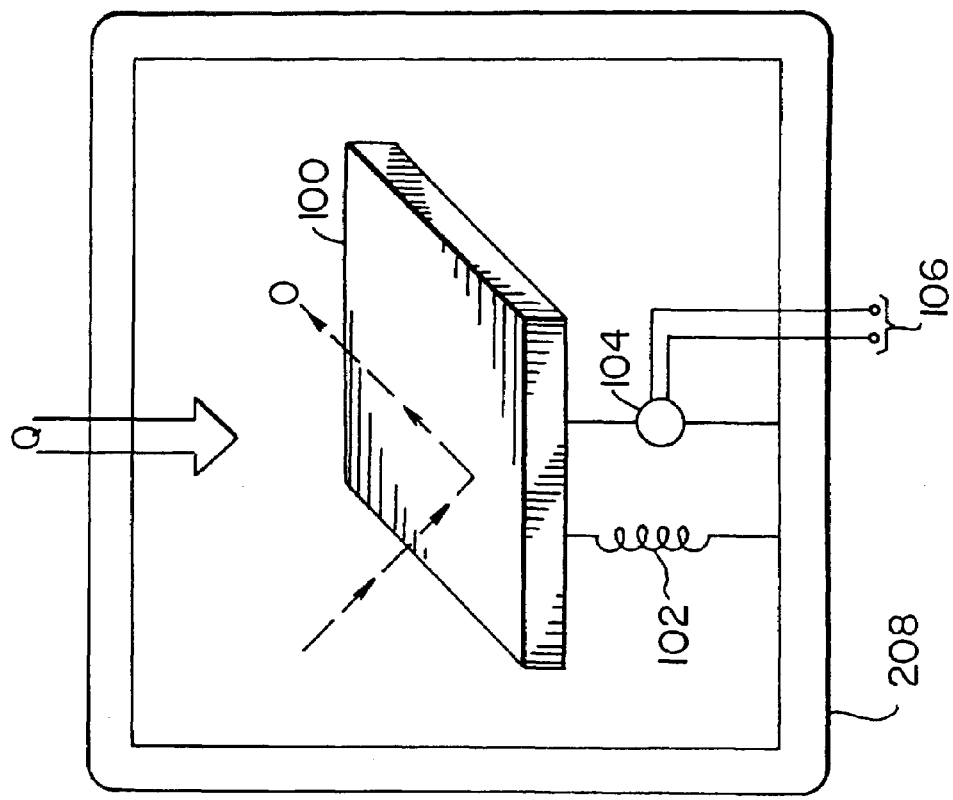
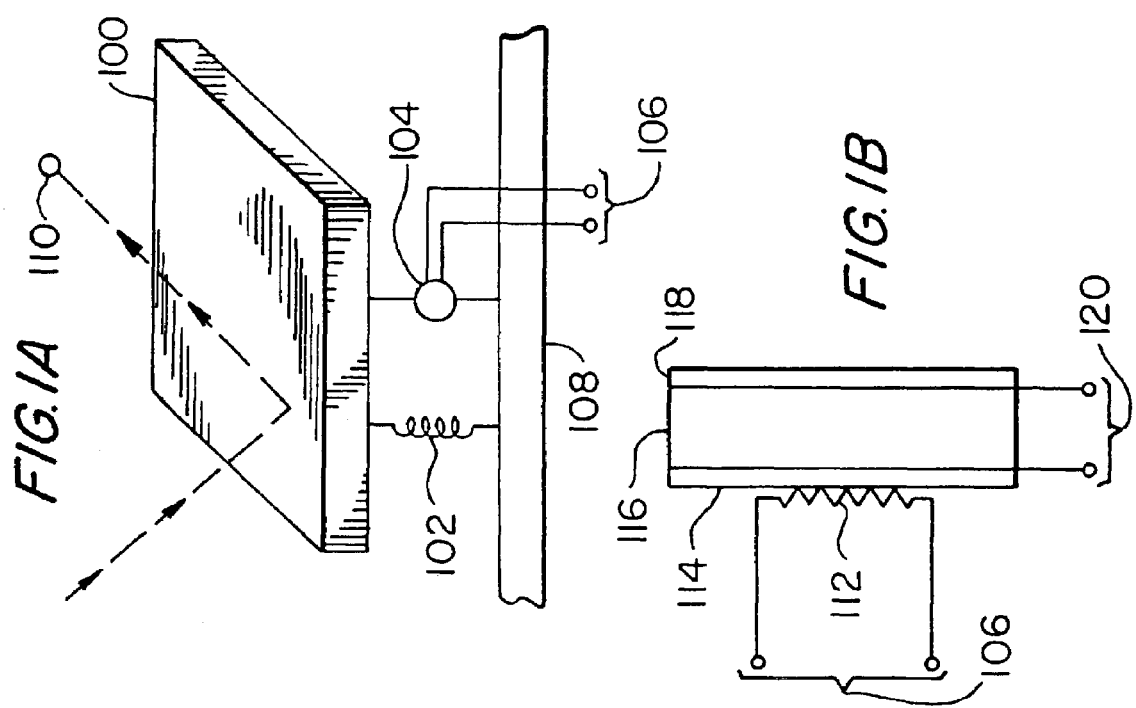

ENERGY CONVERSION SYSTEMS USING NANOMETER SCALE ASSEMBLIES AND METHODS FOR USING SAME

CROSS REFERENCE TO RELATED APPLICATION

This application is a continuation of U.S. patent application Ser. No. 09/885,367, filed Jun. 20, 2001, now U.S. Pat. No. 6,593,666 which is hereby incorporated by reference herein in its entirety.

BACKGROUND OF THE INVENTION

This invention relates to nanometer scale electromechanical systems. In particular, the present invention relates to nanometer scale electromechanical systems that may be used in various applications, such as heat engines, heat pumps, or propulsion systems.

Electromechanical systems that rely on molecular motion are known. For example, U.S. Pat. No. 4,152,537 (the "'537 patent"), describes an electricity generator that produces electrical energy from the random movement of molecules in a gas, and the uneven distribution of thermal energy in different molecules of the gas, which is at an overall uniform temperature.

Other such systems are described in, for example, U.S. Pat. Nos. 3,365,653; 3,495,101, 2,979,551; 3,609,593; 3,252,013 and 3,508,089. These systems produce electricity or devices driven by electricity, such as an oscillator, based on molecular motion and thermal energy.

One problem common to all of these systems is the low level of output power when compared to the amount of power required to operate the systems. For example, such systems often require a certain amount of energy to maintain the systems at a constant overall temperature. While the '537 patent attempted to address some of the known deficiencies in such systems, the electricity generator described therein also suffers from similar deficiencies. For example, the '537 patent attempts to heat the thermocouple junction between two dissimilar materials by simply being in contact with a gas-molecule having an above-average speed. In addition, the '537 patent utilizes an array of electrical rectifiers (see, e.g., rectifier bridge 40 in FIGS. 2 and 4) that may have difficulty in operating properly due to the infinitesimally small voltages produced at the molecular scale.

Moreover, as the use of electronic devices continues to flourish, there is an ever increasing need to provide more efficient and/or quieter ways to cool the components that are typically the heart of such devices. For example, most personal computers include one or more fans that are required to maintain the temperature of the microprocessor within a certain operational range. These fans are often noisy; and often result in large quantities of dirty air being pulled through the computer from the air intakes.

Accordingly, it is an object of the present invention to provide nanometer scale electromechanical systems that efficiently convert molecular-level energy into another form that can be used at a macroscopic scale.

Another object of the present invention is to provide nanometer scale electromechanical systems that efficiently convert molecular-level heat energy into useful mechanical and/or electrical energy.

A still further object of the present invention is to provide nanometer scale electromechanical systems that utilize molecular-level energy to create a pressure differential on a surface of an object to propel the object in a controllable direction.

An even further object of the present invention is to provide nanometer scale electromechanical systems that utilize molecular-level energy to heat or cool an external substance.

SUMMARY OF THE INVENTION

The nanometer scale electromechanical systems of the present invention efficiently convert molecular-level energy from one form into another form by reducing the velocity of the molecules within the working substance. These systems may include, for example, a heat engine that converts molecular-level heat energy into useful mechanical or electrical energy. Such systems may also include a heat pump that utilizes molecular-level energy to either heat or cool a substance. For example, a system of the present invention may be mounted to a microprocessor as the primary cooling device, so that little or no fans would be necessary. In addition, these systems may also include propulsion systems in which molecular-level energy is utilized to create a pressure differential on the surface of an object, thereby providing the ability to propel that object in a controllable direction.

Nanometer scale electromechanical systems constructed in accordance with the present invention may include a large number of nanometer-sized objects, such as paddles, impact masses, and/or tubes, that are placed in a liquid or gas. These objects may be sized on the order of several nanometers per side, and may have a thickness on the order of about one or two nanometers. One side of the paddle is connected to a flexible, spring-like, attachment, that couples the paddles to a common base. Also attached to each paddle is some form of generator device, such as a piezoelectric, electromotive force or electrostatic generator, that converts random molecular motion into electrical, electromagnetic or thermal energy.

The nanometer-sized paddles, in conjunction with an associated generator, reduce the speed of individual molecules which results in a reduction of thermal energy within the working fluid. The generated electrical energy may be converted back to thermal energy at a higher temperature than the working fluid and used to establish a temperature differential that is capable of performing useful work. Essentially, the paddles are configured to be immersed in a working substance. The paddles move in a random manner within the working substance due to variations in the thermal motion of the molecules of the working substance. This movement necessarily results from collisions between the molecules of the working substance and the paddles which are large enough to cause the paddles to oscillate. The kinetic energy from this oscillation may then be converted into electrical, electromagnetic or thermal energy by various methods, as described above.

Nanometer scale electromechanical systems constructed in accordance with the present invention also provide components that efficiently collect and sum the outputs of the numerous paddles so that a useful electrical output is produced. For example, one embodiment of the present invention includes the use of an array of resistive elements, one for each paddle, that are in contact with one side of the thermocouple. The other side of the thermocouple is placed in thermal contact with something else that is at an ambient temperature (such as a gas or liquid). Each of the thermocouples produces an output (i.e., a DC current and voltage) that can be summed through a simple series connection to produce an output, depending on the number of paddles and configuration, on the order of several milliwatts.

In one particular embodiment, a nanometer scale electromechanical system constructed in accordance with the present invention may include an array of nanotubes, such as tubes made of carbon, which are coupled between two plates of a capacitor. One of the tubes is physically connected to one plate of the capacitor, while the other end is free to move. The entire assembly is immersed in a fluid (i.e., a liquid or a gas). A voltage is applied to the capacitor (across the plates), which creates an electric field ("E") that keeps the length of the tubes perpendicular to the surface of the capacitor plate. The "free" ends of the tubes, which are immersed in a working substance, move erratically due to collisions between the molecules of the working substance and the tubes, causing some of the tubes collide into each other. Kinetic energy of the colliding tubes, as well as other energy, may be converted for one or more useful purposes, as previously described.

In another embodiment of the present invention, numerous nanotubes are connected at each end to an electrically and thermally conductive rail. Each of the tubes is installed such that there is slack, or bend, in the tube. The slack permits the tubes to vibrate in response to random pressure variations from surrounding fluid (gas or liquid). In this case, an external magnetic field ("B") is applied to the entire assembly which is perpendicular to the tubes and rails. Heat generated in the tubes, from the induced current, flows down the tubes to the thermally conductive rails, which are attached to a thermally conductive plate.

Further features of the invention, its nature and various advantages will be more apparent from the accompanying drawings and the following detailed description of the preferred embodiments.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which:

FIG. 1A is an illustrative schematic diagram of a portion of a nanometer scale electromechanical system constructed in accordance with the present invention;

FIG. 1B is an illustrative schematic diagram of one embodiment of conversion circuitry constructed in accordance with the principles of the present invention;

FIG. 2 is an illustrative schematic diagram of a portion of another nanometer scale electromechanical system constructed in accordance with the principles of the present invention;

DETAILED DESCRIPTION OF THE INVENTION

Figure 3:
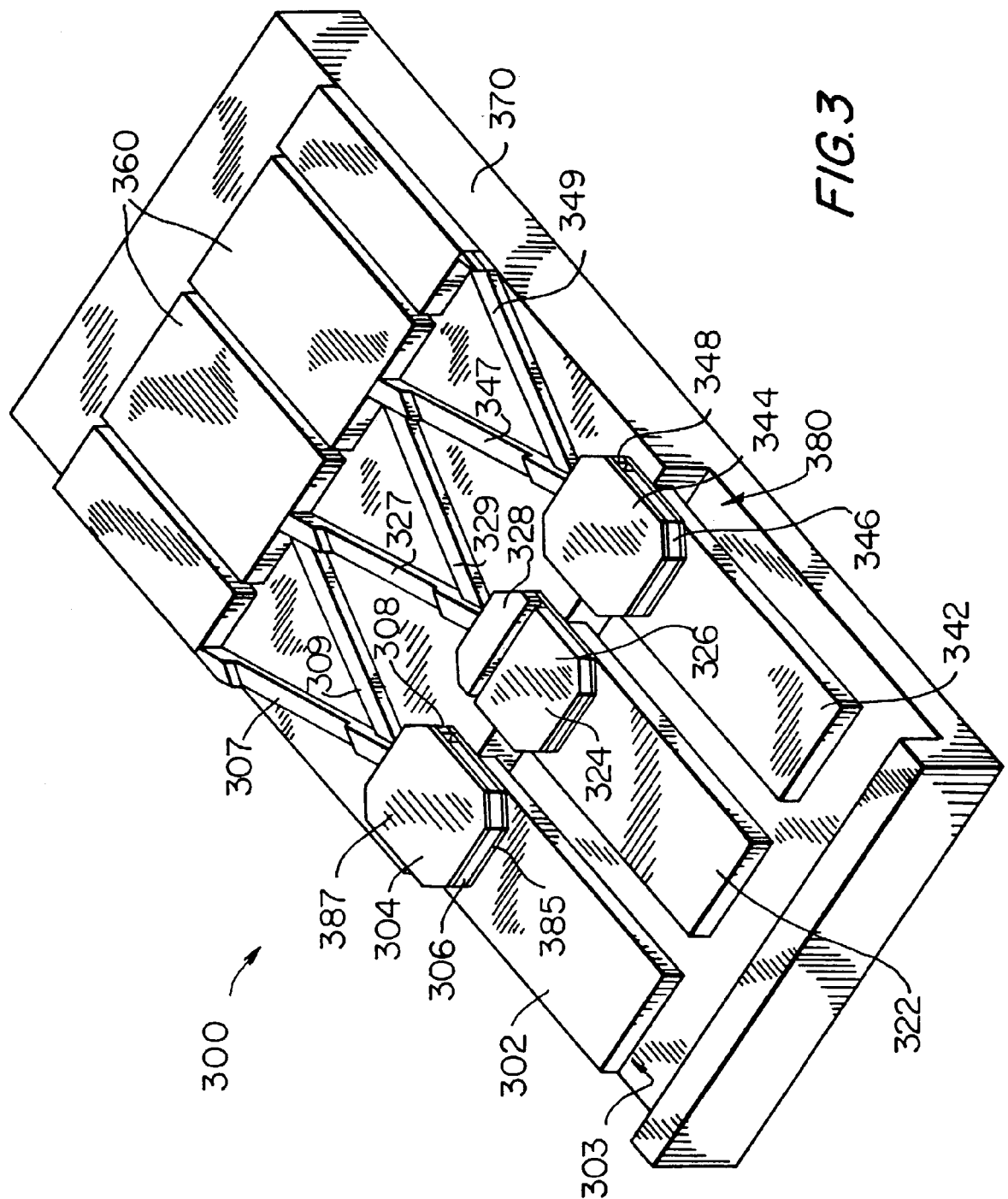
FIG. 3 is a perspective view of a portion of a nanometer scale electromechanical system constructed in accordance with the principles of the present invention.

FIG. 1A shows an illustrative example of a portion of a nanometer scale electromechanical system constructed in accordance with the present invention. The portion shown includes an impact mass in the form of paddle 100, a restraining member 102, an generator device 104 (which provides an electrical output at leads 106), and a base 108 (which is typically thousands or millions times larger than paddle 100). Paddle 100 is attached to base 108, which may be thermally conductive, but need not be, so that paddle 100 may be moved within a predetermined range of distance in one or more directions (such as laterally, or up and down). A complete energy conversion system using nanometer scale assemblies would typically include a million or more of the devices shown in FIG. 1A, as will become more apparent below (see, for example, FIGS. 5 and 6).

Paddle 100 may be constructed, for example, from a substance such as carbon or silicon, although persons skilled in the art will appreciate that variations may be made in the fabrication materials of paddle 100 without departing from the spirit of the present invention. Moreover, paddle 100 can generally be manufactured using known semiconductor fabrication techniques such as sputtering, etching, photolithography, etc.

In addition, each paddle 100 may be constructed to be about five nanometers on each side, and have a height of about one to two nanometers—this size being selected so that the effects of Brownian motion are large enough to overcome inertia of paddle 100 and the spring constant of restraining member 102. Persons skilled in the art will appreciate that the specific size of paddle 100 is not critical to the basic operation of the present invention, provided that paddle 100 is able to move in an irregular manner within the working substance as a result of random variations in the velocity of the working substance molecules that strike paddle 100.

Also shown in FIG. 1A, is molecule 110 which is shown as having bounced off of paddle 100, and is now traveling at a reduced velocity. Persons skilled in the art will appreciate that, while some molecules will have a reduced velocity as a result of the impact, others may exhibit little change in velocity, and others may actually achieve an increased velocity. In general however, and in accordance with the present invention, the impact of molecule 110 with paddle 100 results, on the average, with a reduction in velocity.

The molecule is a molecule of the working substance of the system, which is preferably a fluid (i.e., a gas or a liquid), but may also be a solid. The fluid may be kept at atmospheric pressure or it may be kept at an elevated pressure, such as, for example a pressure in excess of about 15 PSI. As described above, the pressure of the working fluid may have an impact in the output provided by the system. Molecule 110 strikes paddle 100, thereby causing molecule 110 to experience a reduction in velocity. The reduction in velocity corresponds to a reduction in temperature of the working substance of the system.

The reduction in velocity of molecule 110 is caused by paddle 100 in conjunction with device 104, which may be any one of a variety of devices without departing from the present invention. For example, device 104 may be a piezoelectric device, or it may be a electromotive force or electrostatic generator. In each instance, device 104 converts the energy of the impact mass, from the impact of molecule 110 into impact mass 100, into electrical energy that is output via leads 106.

The amount of electrical energy output via leads 106, even under the most favorable conditions will be very small. For example, the output of paddle 100 may be on the order of about $10^{-12}$ watts, depending on the size of the device and various other factors. Accordingly, for the system to provide useful output power, such as, for example, a few microwatts, the system requires that millions of such paddles be fabricated, and that they be connected together in some fashion, so that the outputs of all, or substantially all, of them can be summed into a single output signal.

If a million or so of paddles 100 were arranged together in an array (see, for example, FIGS. 5 and 6), one way to sum all of the energy from each of those paddles would be to couple the leads 106 of each paddle 100 to resistive element 112 (see FIG. 1B), and have resistive element 112 be in thermal contact with one side 114 of thermocouple 116. The other side 118 of thermocouple 116 would then be in thermal contact with a heat sink or some other substance at ambient temperature (which may even include the working substance itself). Thermocouple 116 is a thermoelectric generator that, in response to a temperature differential, produces a voltage across a pair of leads and, if the leads are connected to a load, a DC current.

Variations in molecular impacts on paddle 100 will cause an increase in the temperature of resistive element 112, which will then be converted into electrical energy by thermocouple 116 and output via leads 120. One advantage of the use of resistive elements is the fact that, because a resistive load is independent of current/polarity direction, there is no need for a rectifier associated with each paddle. Thus, in accordance with the present invention, even infinitesimal voltages produced by the impacts of molecules 110 on paddles 100 can be used to heat resistive elements to useful values. Each thermocouple in the array, in turn, produces an output having a DC voltage, and current if connected through an electrical load. All of these outputs can then be connected together in series to produce an output of at least several microwatts.

If additional power is needed, numerous subassemblies of paddles could be coupled together in series. For example, if a given subassembly was formed to include an array of paddle assemblies in which each assembly occupied approximately one hundred square nanometers, a square centimeter assembly would include roughly one trillion paddle assemblies. Then, any number of the one square centimeter subassemblies could be coupled together in series or parallel to achieve the desired ratio of voltage and current.

In addition, with a combined output on the order of approximately 700 mV, the output of each one square centimeter assembly could even be manipulated using conventional semiconductor switches. Thus, a given component could be fabricated by fabricating many one square centimeter assemblies next to each other on a thin, flexible sheet of material (such as aluminum) in a continuous process. The resultant sheets of material could then be cut up and rolled into a tube, similar to the fabrication process of some capacitors.

Persons skilled in the art will appreciate that the electrical output of these devices per unit surface area is proportional to the pressure of the fluid, the average temperature of the fluid, the oscillation frequency of the paddle and the mass of the fluid molecules used (regardless of whether the fluid is a gas or a liquid). The output per unit area is inversely proportional to the size of the paddle and the density of the paddle material. Accordingly, by choosing a heavy molecule gas, such as xenon, or by using a fluid heavily laden with particulates, such as air laden with carbon molecules, and/or by immersing the paddles in the gas at elevated pressure, such as 100 times atmospheric pressure, the power output of the units can be increased by a factor of over 100, as compared with units operating in air at atmospheric pressure.

FIG. 2 shows a alternate embodiment of the paddle assembly shown in FIG. 1. In particular, the assembly in FIG. 2 varies from that in FIG. 1 in that restraining member 102 is coupled to a housing 208 instead of base 108. Housing 208 is a thermally conductive chamber which includes the ability to receive thermal inputs (shown as "Q" in FIG. 2). In this embodiment, the influx of heat Q is converted into electrical energy that is output via each of leads 106. In addition, while the assembly shown in FIG. 1 does not include a housing, it may be desirable, but is certainly not required, to locate that assembly in a housing as well, if only to protect it from contaminates.

The embodiment shown in FIG. 2 may be used to illustrate one of the advantages of the present invention, in that the nanometer scale energy conversion systems of the present invention may be used as a heat pump. For example, thermally conductive housing 208 will be cooled as a result of the molecular impacts on paddles 100 and subsequent conversion of the paddle kinetic energy into electrical energy. Warm or hot air may be cooled by blowing it across housing 208. On the other hand, resistive load 112 may be connected in series with leads 106, which results in the temperature of resistive load 112 being raised. Cool air may be warmed by blowing it over resistive load 112. In this manner, the same assembly may be used to heat an external substance or to cool an external substance.

FIG. 3 shows another embodiment of a portion of a nanometer scale electromechanical system 300 constructed in accordance with the principles of the present invention. The portion of system 300 shown in FIG. 3 includes three paddle assemblies 302, 322 and 342, which are each coupled to one of piezoelectric generators 304, 324 and 344. Each of paddle assemblies 302, 322 and 342 is somewhat similar to paddle assembly 100 of FIG. 1, in that each paddle assembly shown in FIG. 3 also includes a substantially planar surface that is held in place such that it may move in response to molecular impacts. In this instance, paddle assemblies 302, 322 and 342 are attached at one end which is generally referred to by numeral 380 in FIG. 3.

The piezoelectric generators are each formed from a portion of piezoelectric material and a resistor assembly. Generator 324, for example, which is substantially similar to generators 304 and 344, is illustrated to show the division between piezoelectric material 326 and resistor assembly 328. However, the division between the piezoelectric portion and the resistor assembly may also be observed in FIG. 3 for generators 304 and 344.

Resistor assemblies 308, 328 and 348 are each connected to two wires that are made from different material. For example, each of wires 307, 327 and 347 are made from one material, while wires 309, 329 and 349 are all made from a different material. The other end of all of the wires are connected to a series of heat sinks 360, which are themselves mechanically coupled to a substrate 370 (which may, for example, be a silicon substrate). It should be noted that paddle assemblies 302, 322 and 342 are only connected to substrate 370 at one end, generally referred to by reference number 380, so that, for example, the paddle assemblies may easily vibrate up and down.

System 300 operates in accordance with the present invention as follows. The entire system is immersed in a fluid (i.e., a liquid or a gas) that is the working substance. Statistical variations in the velocity of working substance molecules that strike paddle 302, for example, cause the free end of paddle 302 to vibrate up and down. The up and down motion of paddle 302 causes strain in piezoelectric material 306, which generates a voltage between lower conductive outer layer 385 and upper conductive layer 387 of material 306.

Outer conductive layers 385 and 387 of material 306 are in contact with resistor assembly 308, so that a current flows from material 306 through resistor 308 and back to material 306. The current through resistor 308 heats up the resistor, which is coupled to one side of the thermoelectric generator formed by wires 307 and 309 (which, as described above, are made from different materials). The other side of the thermoelectric generator (which may also be referred to as a thermocouple) is coupled to heat sinks 360, which are at a lower temperature. Persons skilled in the art will appreciate that other devices may be used, such as thermal to electric heat engines (such as, for example, a thermionic heat engine), rather than thermoelectric generators described herein, without departing from the spirit of the present invention.

The temperature differential causes the thermoelectric generator to produce a voltage, which, as described more fully below, may be combined with the voltages from other paddle assemblies to provide a system output voltage. These voltages, in accordance with the present invention, may be coupled together in series to produce an electrical output at a useable level from system 300. The process of summing voltages from each paddle assembly is more particularly illustrated with respect to FIGS. 5 and 6 below.

Persons skilled in the art will appreciate that, while system 300 has been described as a system that converts kinetic energy of the impact mass (resulting from the Brownian motion of the impact mass immersed in a working substance) to AC electrical energy to thermal energy and to DC electrical energy, system 300 may, with minor changes, directly produce DC electric energy as a result of this kinetic energy.

In particular, it should be noted that movement of paddle 302 upward and then downward to its resting location generates a voltage of one polarity. Movement downward and then upward back to the resting location generates a voltage in the opposite polarity. Thus, in accordance with the present invention, paddles 302 can be substantially limited to moving between a neutral point (i.e., the resting location) and a single limit point (versus normal vibration that goes from a first limit point, through the neutral point to a second limit point and back).

Accordingly, if paddle 302 were limited to "upward" movement by placing an object at location 303 (i.e., toward the free end of paddle 302), the output voltage would be limited to one polarity (essentially, pulsating DC). In such a configuration, the outputs of the piezoelectric generators (such as generator 304) could be directly coupled together in series, which would eliminate the need of, for example, resistor assembly 308, wires 307 and 309 and heat sinks 360, while still providing useful levels of electrical power without the need for rectification circuitry.

Figure 4:
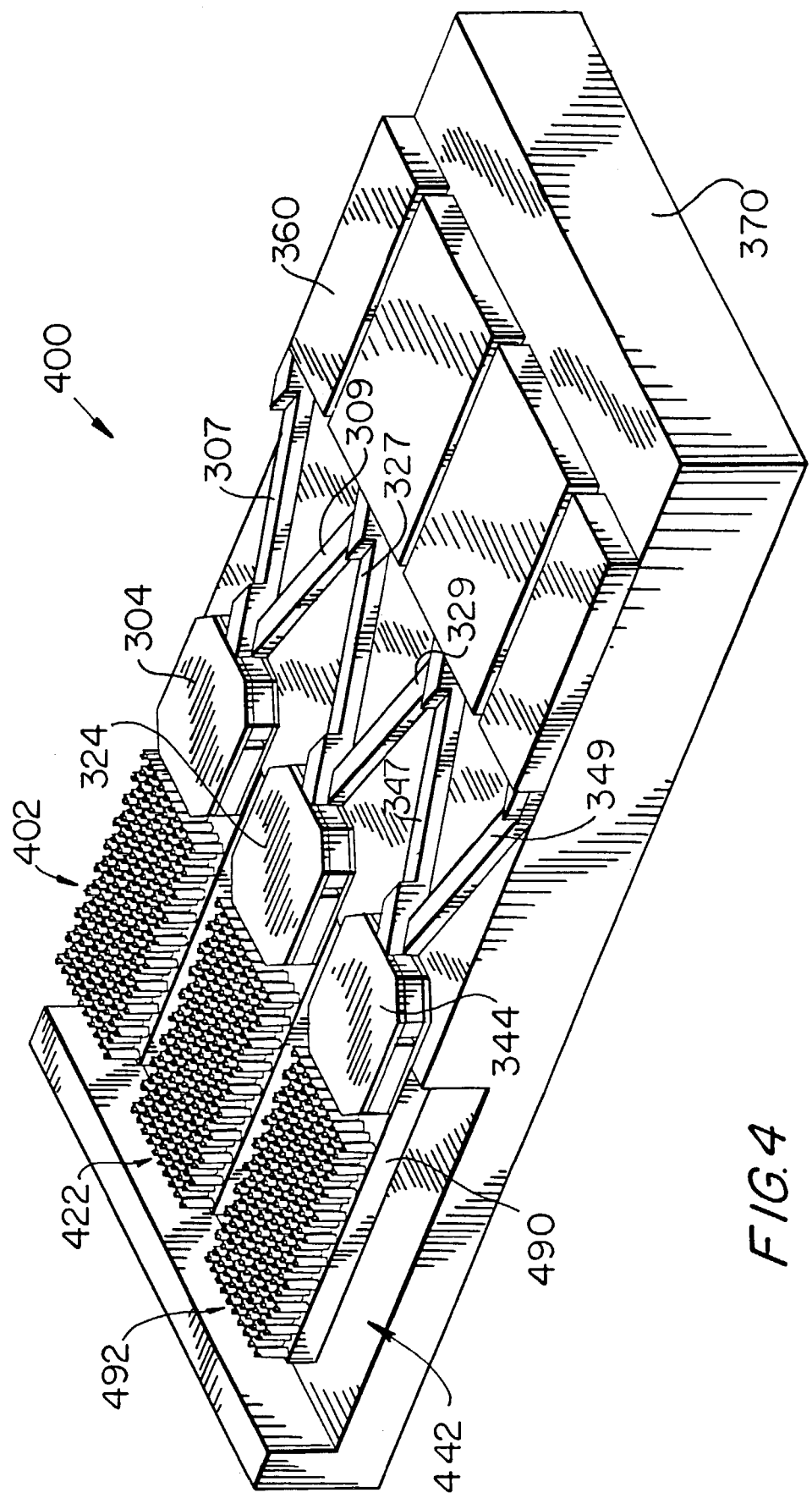
FIG. 4 is a perspective view of a portion of another nanometer scale electromechanical system constructed in accordance with the principles of the present invention.

FIG. 4 shows another embodiment of a portion of a nanometer scale electromechanical system 400 constructed in accordance with the principles of the present invention. The portion of system 400 shown in FIG. 4 includes three paddle assemblies 402, 422 and 442, which are each coupled to one of piezoelectric generators 304, 324 and 344 (which were described above with respect to FIG. 3).

As shown in FIG. 4, each of the paddle assemblies 402, 422 and 442 includes an impact mass 490 and a multitude of nanotubes 492 that are mounted on impact mass 490 such that they are substantially perpendicular to impact mass 490. Each of nanotubes 492 may, for example, be constructed of a material such as carbon, having a diameter of about approximately 2 nanometers and a height of about approximately 25-50 nanometers (persons skilled in the art will appreciate that the dimensions of nanotubes 492 may be varied without departing from the spirit of the present invention). Moreover, the stiffness and alignment of nanotubes 492 may be controlled by the application of a static voltage, such as that shown in FIG. 7, and described below.

System 400 operates in very much the same way as previously described for system 300. Statistical variation in gas pressure about paddles 402, 422 and 442 cause the free end of paddle 402 to vibrate up and down, thereby causing strain in the piezoelectric material, which generates a voltage on the conductive outer layers of the piezoelectric material. In system 400, however, the up and down motion of the paddles in system 400 may be enhanced by nanotubes 492, which cause additional molecular impacts.

The outer conductive layers of the piezoelectric material are in contact with resistor assembly, so that a current flows, which heats up the resistor. The thermoelectric generator formed, for example, by wires 307 and 309 is between the heated resistor and the heat sinks 360, which are at a lower temperature. The temperature differential causes the thermoelectric generator to produce a voltage.

Figure 5:
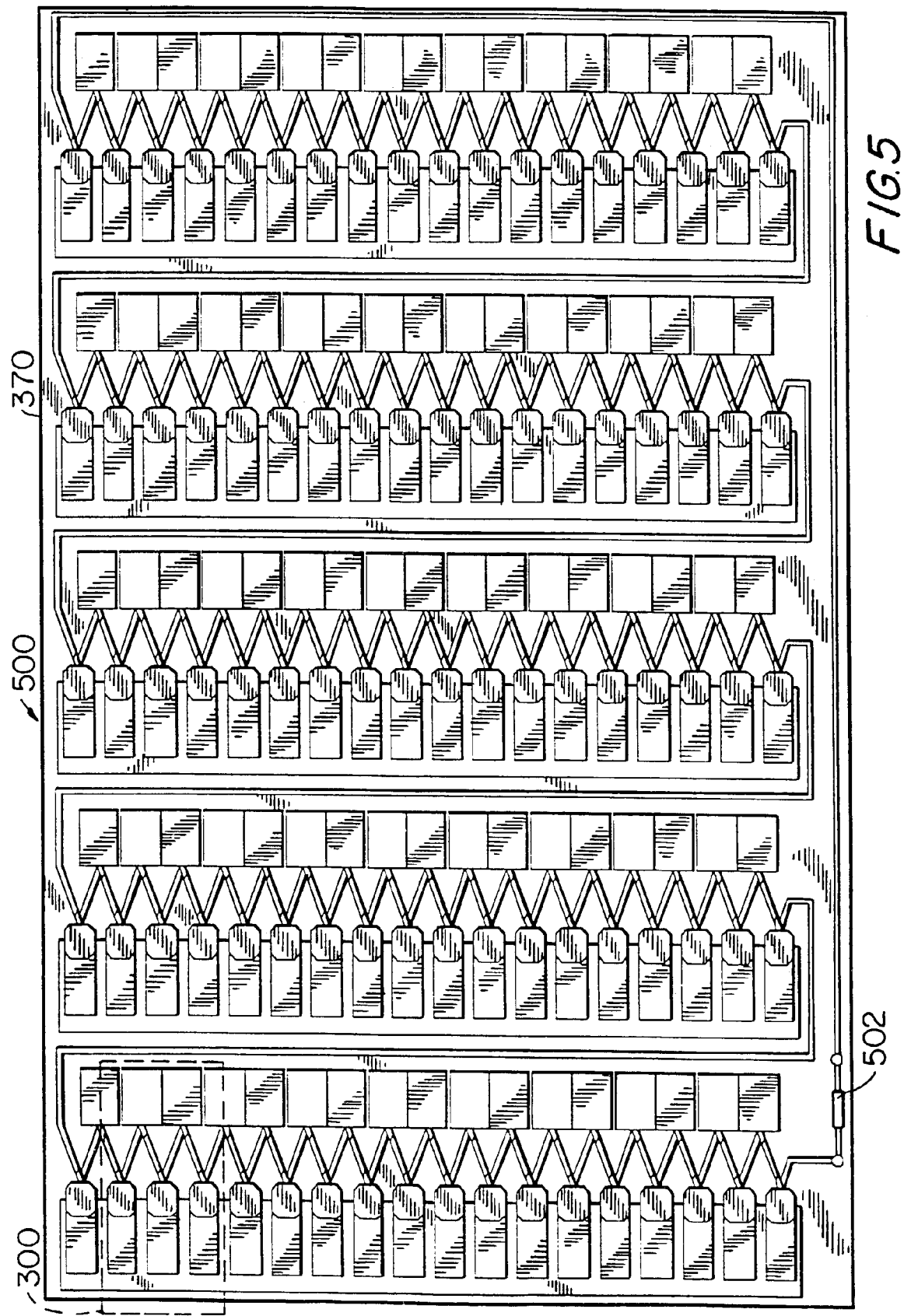
FIG. 5 is an illustrative schematic diagram of a nanometer scale electromechanical system constructed in accordance with the principles of the present invention.
Figure 6:
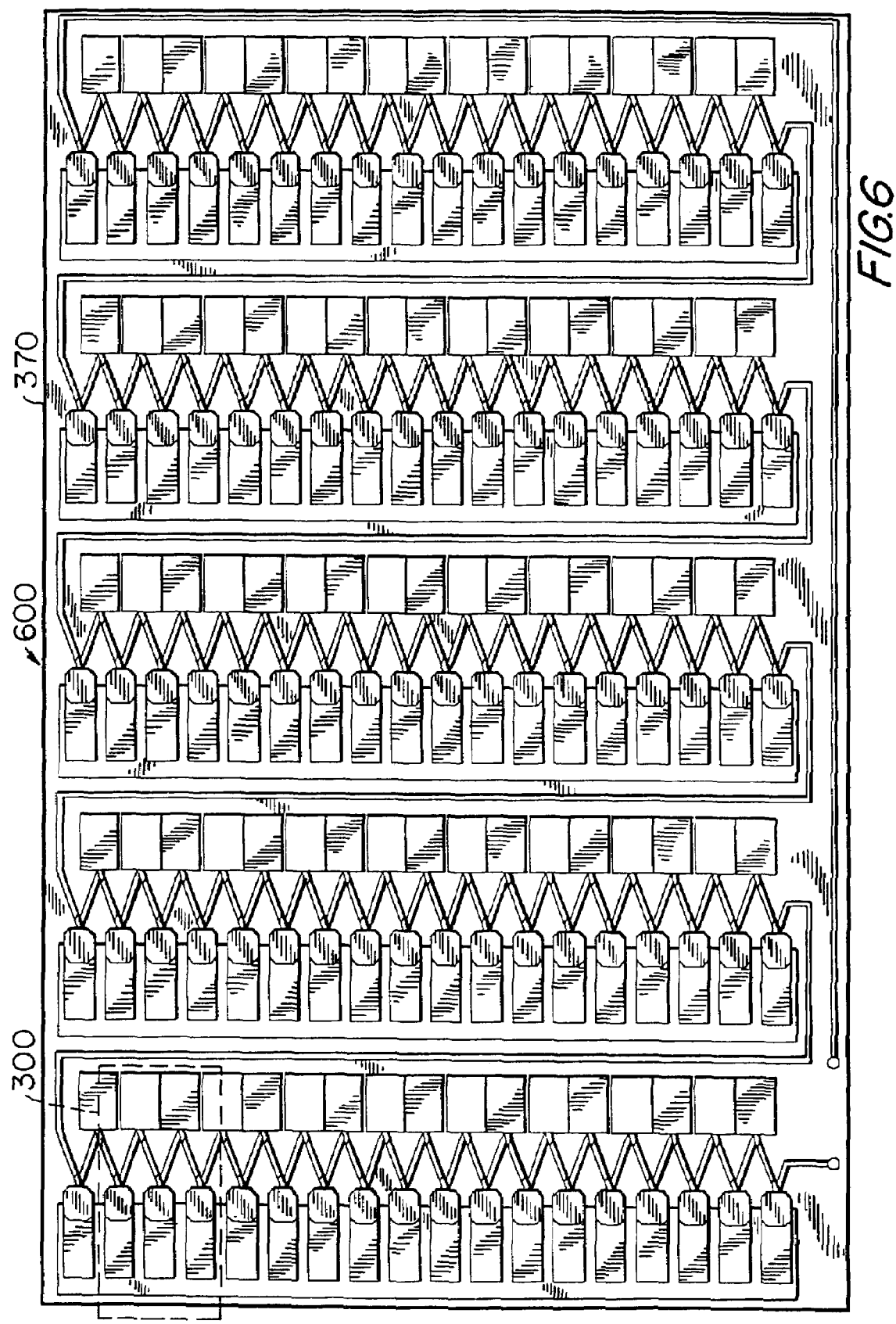
FIG. 6 is an illustrative schematic diagram of another nanometer scale electromechanical system constructed in accordance with the principles of the present invention.

FIGS. 5 and 6 show two similar configurations of nanometer scale electromechanical systems 500 and 600, respectively, that are each constructed in accordance with the principles of the present invention. Systems 500 and 600 each include a multitude of paddle-assemblies 302, coupled to generators 304 which are themselves, coupled to wires 307 and 309 that are connected to heat sinks 360. This may be more apparent by viewing the dashed box showing where the portion of system 300 of FIG. 3, for example, may be found. As shown in FIGS. 5 and 6, systems 500 and 600 each include ninety paddle assemblies 302 and the associated components (i.e., generators, wires and heat sinks).

In practice, nanometer scale electromechanical systems constructed accordance with the present invention may include a billion or more paddle assemblies on a single substrate. The output voltage across each pair of wires extending from each thermoelectric generator on a single substrate are, in accordance with the present invention, coupled together in series to provide a single output signal for the system. That output signal may have a voltage that may be on the order of a volt, depending on the number of individual components used and the specific fabrication techniques used to manufacture those components. The primary difference between systems 500 and 600, is that system 500 includes a load resistor 502 while system 600 does not.

Persons skilled in the art will appreciate that, while load resistor 502 is shown as being mounted to substrate 370, it may be preferable to thermally isolate load resistor from the working fluid substrate 370 is immersed in so that heat dissipated by load resistor 502 does not affect the temperature of the working fluid.

Figure 7:
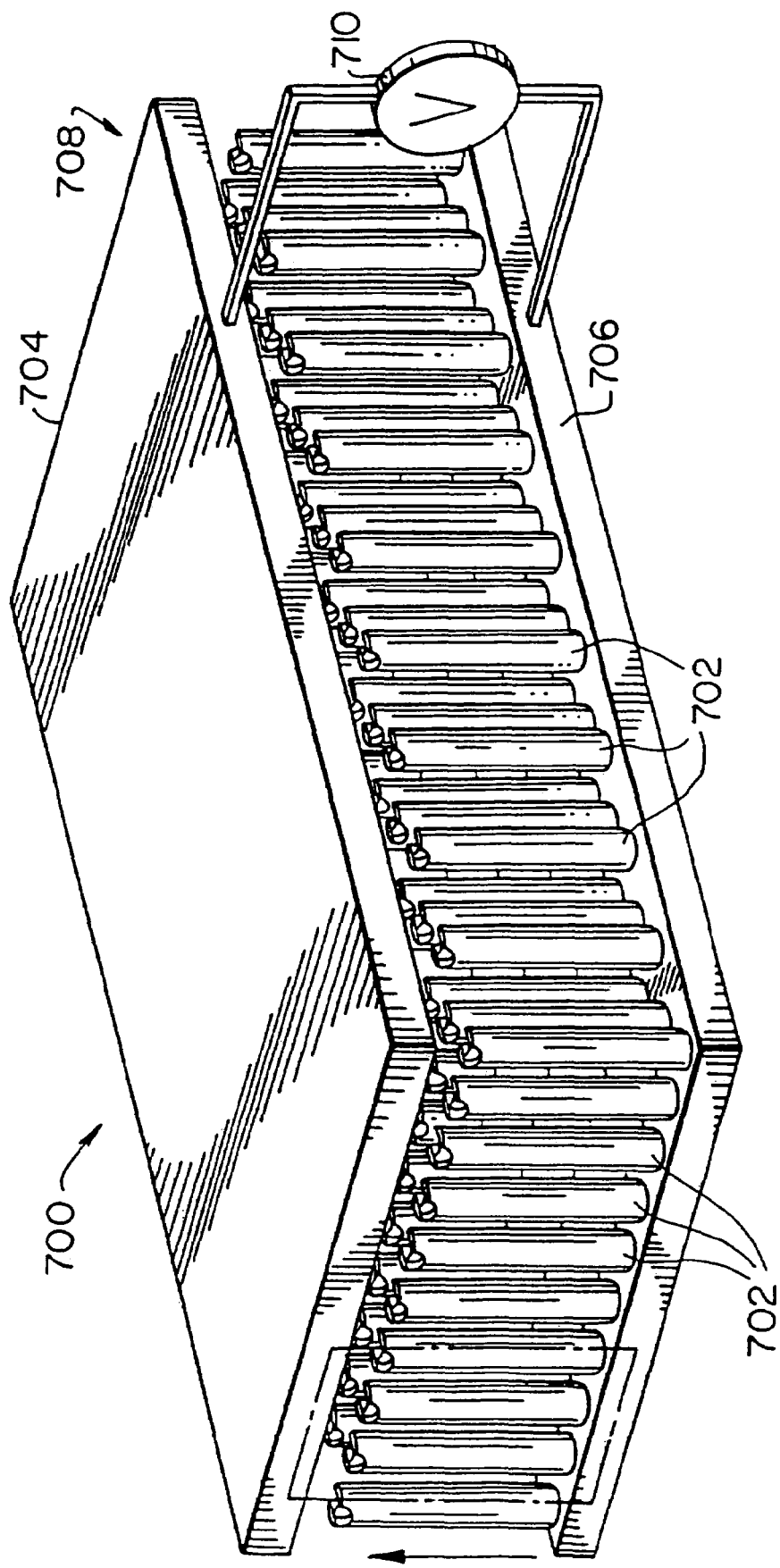
FIG. 7 is a perspective view of another nanometer scale electromechanical system constructed in accordance with the principles of the present invention.

FIG. 7 shows another embodiment of a nanometer scale electromechanical system 700 constructed in accordance with the principles of the present invention. System 700 includes an array of nanotubes 702 located between an upper plate 704 and lower plate 706 of capacitor 708, and a source of voltage 710, which is also coupled across the plates of capacitor 708. Each of nanotubes 702 may, for example, be constructed of a material such as carbon, having a diameter of about approximately 2 nanometers and a height of about approximately 25-50 nanometers (persons skilled in the art will appreciate that the dimensions of nanotubes 702 may be varied without departing from the spirit of the present invention).

One end of each nanotube 702 is fixed to lower plate 706 of capacitor 708. The other end of each nanotube 702 is free to move. The entire assembly 700 is then typically immersed in a fluid (i.e., gas or liquid). Once a voltage V is applied from source 710 across the plates of capacitor 708, an electric field E is produced that creates a force that helps keep the length of nanotubes 702 oriented substantially perpendicular with the surface of capacitor plates 704 and 706. Statistical variations in the speed and direction of working fluid molecules which strike nanotubes 702 cause statistical variations in fluid pressure about nanotubes 702 which, in turn, cause nanotubes 702 to move erratically as illustrated in FIGS. 8 and 9.

Figure 8:
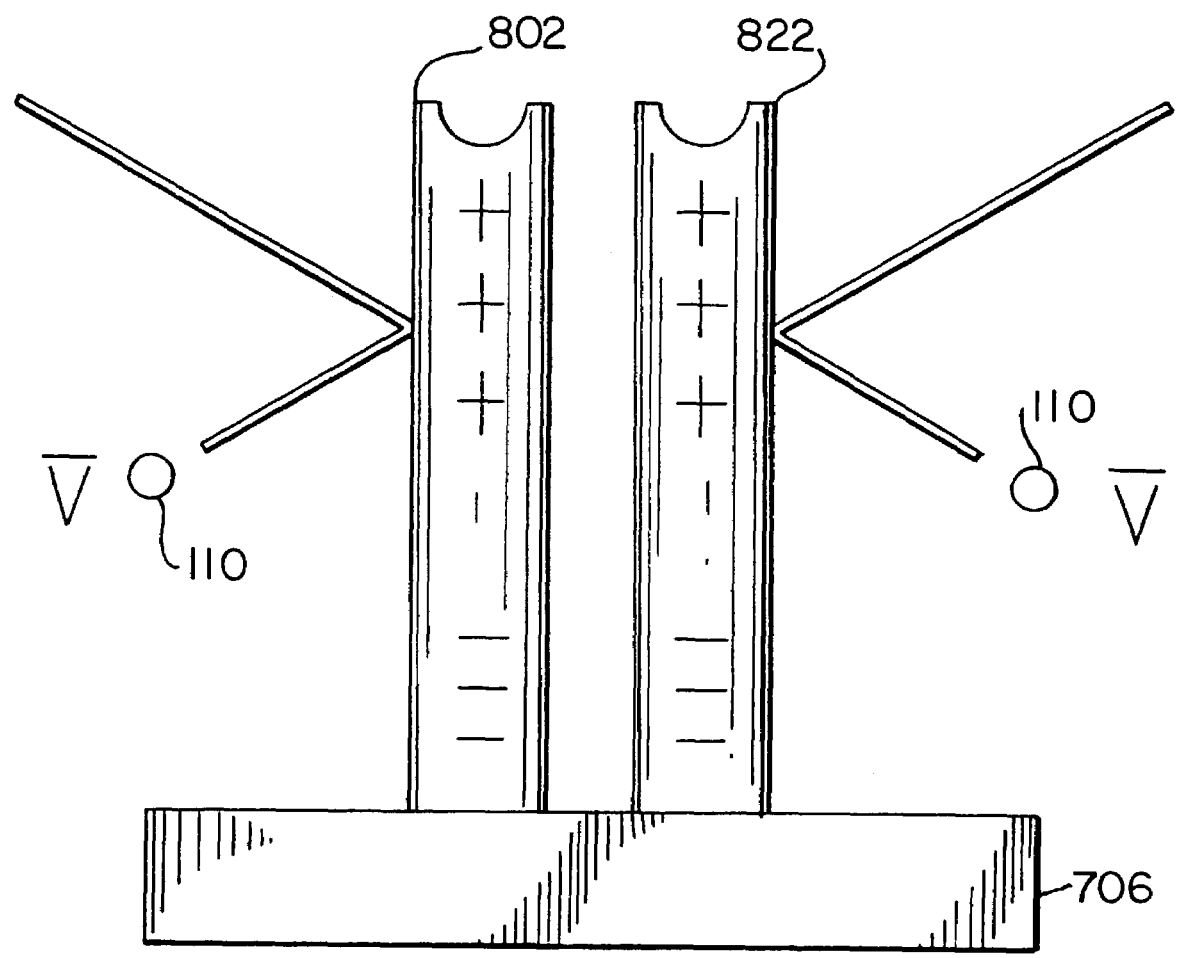
FIG. 8 is an illustrative schematic diagram of a portion of the nanometer scale electromechanical system of FIG. 7.

As shown in FIG. 8, nanotubes 802 and 822 (which are simply any two adjacent nanotubes 702) are substantially perpendicular to lower capacitor plate 706 even though individual molecules 110 have recently impacted each nanotube. In this instance, there is no variation in the gas pressure on either side of the nanotubes, and the tubes remain erect. Persons skilled in the art will appreciate that, while the interaction of two nanotubes is shown, the molecular impact of thousands or millions of nanotubes would be occurring simultaneously.

Figure 9:
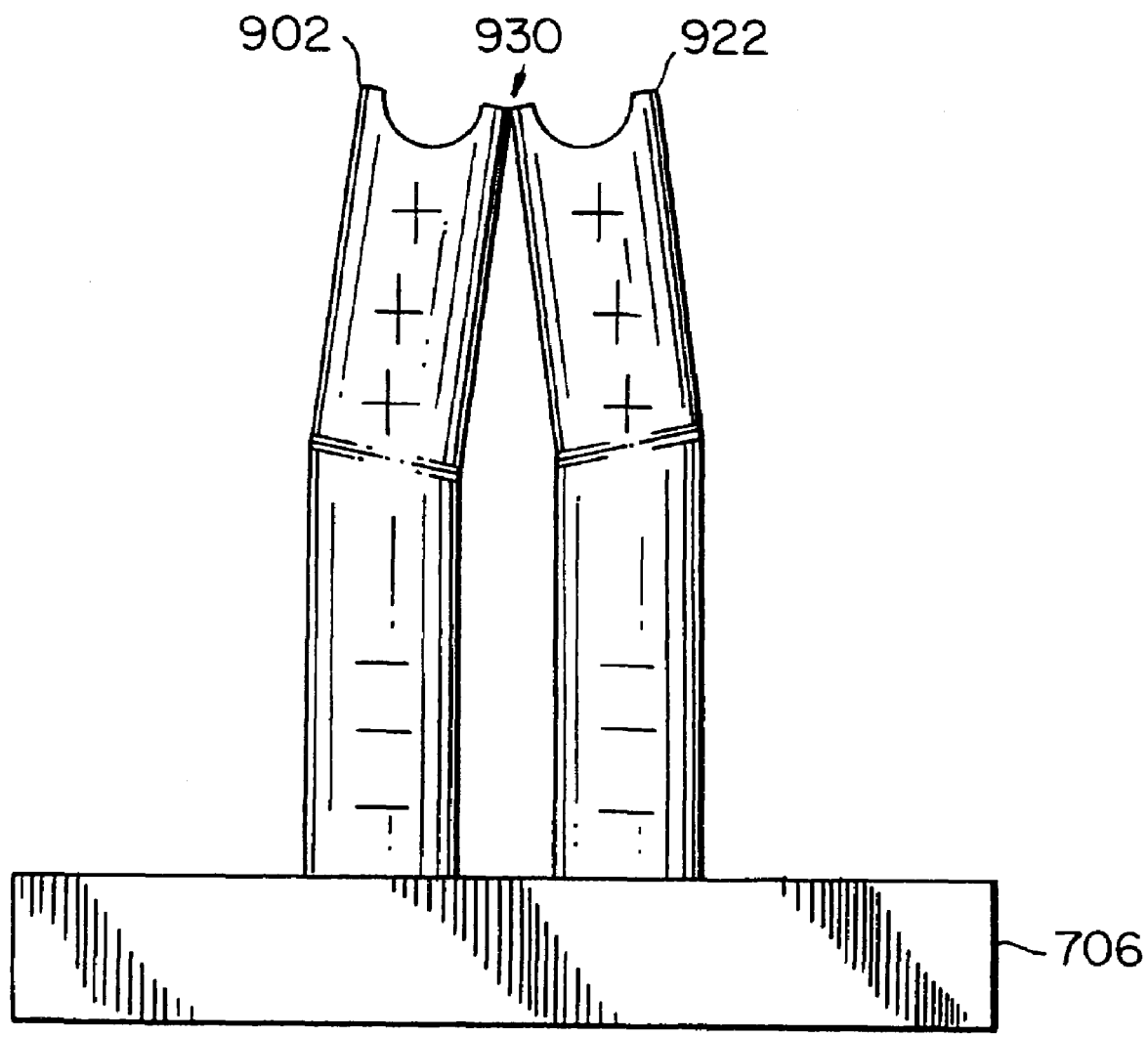
FIG. 9 is another illustrative schematic diagram of a portion of the nanometer scale electromechanical system of FIG. 7.

FIG. 9, on the other hand, illustrates the effect of statistical variation in fluid pressure about nanotubes 902 and 922 (which, like nanotubes 802 and 822, are simply two adjacent nanotubes 702) resulting from variations in the thermal movement of working fluid molecules, which cause the free ends of nanotubes 902 and 922 to collide at location 930. The kinetic energy of colliding nanotubes 902 and 922 is partially converted into thermal energy as a result of the friction from contact and as the tubes slide past each other. The thermal energy is conducted down the length of nanotubes 902 and 922 to thermally conductive plate 706.

In addition, as illustrated in FIGS. 8 and 9, each of nanotubes 702 (or nanotubes 802, 822, 902 and 922) has an electrostatic charge due to the electric field E between capacitor plates 704 and 706. The collision of nanotubes 902 and 922 further dissipates tube kinetic energy by accelerating electrical charges, which in turn produces electromagnetic waves, at the free end of the nanotubes. In this manner, a portion of the kinetic energy of the working fluid is transferred to lower capacitor plate 706, and to the surrounding space, as electromagnetic energy resulting in a net effect of cooling the working substance and heating lower capacitor plate 706. This temperature differential may then be used to directly heat or cool an area of space or to power a heat engine.

Figure 10:
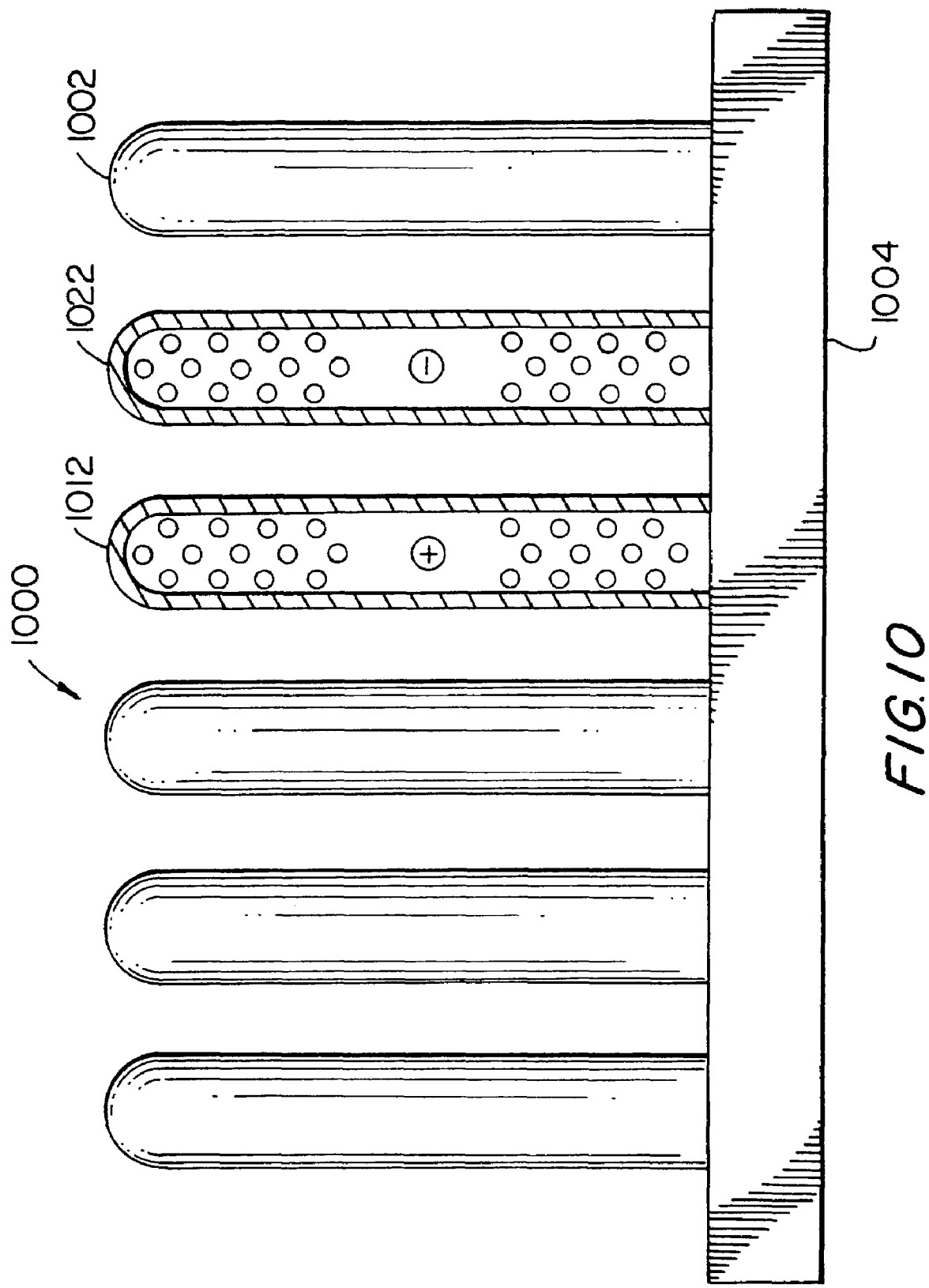
FIG. 10 is a cross-sectional view of another nanometer scale electromechanical system constructed in accordance with the principles of the present invention.

FIG. 10 shows another embodiment of a nanometer scale electromechanical assembly 1000 constructed in accordance with the present invention. Assembly 1000 includes many nanotubes 1002, all connected to a base 1004. Unlike the previous embodiments, nanotubes 1002 are closed at their upper end such that gas molecules are captured within each nanotube 1002. In addition, as shown in FIG. 10, at least one molecule in each nanotube 1002 is electrically charged (for example, individual nanotube 1012 includes at least one positively charged molecule, while individual nanotube 1022 includes at least one negatively charged molecule).

Assembly 1000 is configured such that the net charge of nanotubes 1002 in the assembly is zero, with half of the tubes including positive charges and the other half including negative charges. In this embodiment, as the charged molecules bounce against the nanotube walls and the other molecules within the nanotubes, an acceleration of charge results that generates electromagnetic waves which pass through the tube assembly to the surrounding space. As a result of the electromagnetic radiation, gas within nanotubes 1002 cools, which cools thermally conductive base 1004. In this instance, the reduced temperature of base 1004 may be utilized to cool a volume of fluid, or can be used as the "cold side" of a heat engine, as will be apparent to persons skilled in the art.

Figure 11:
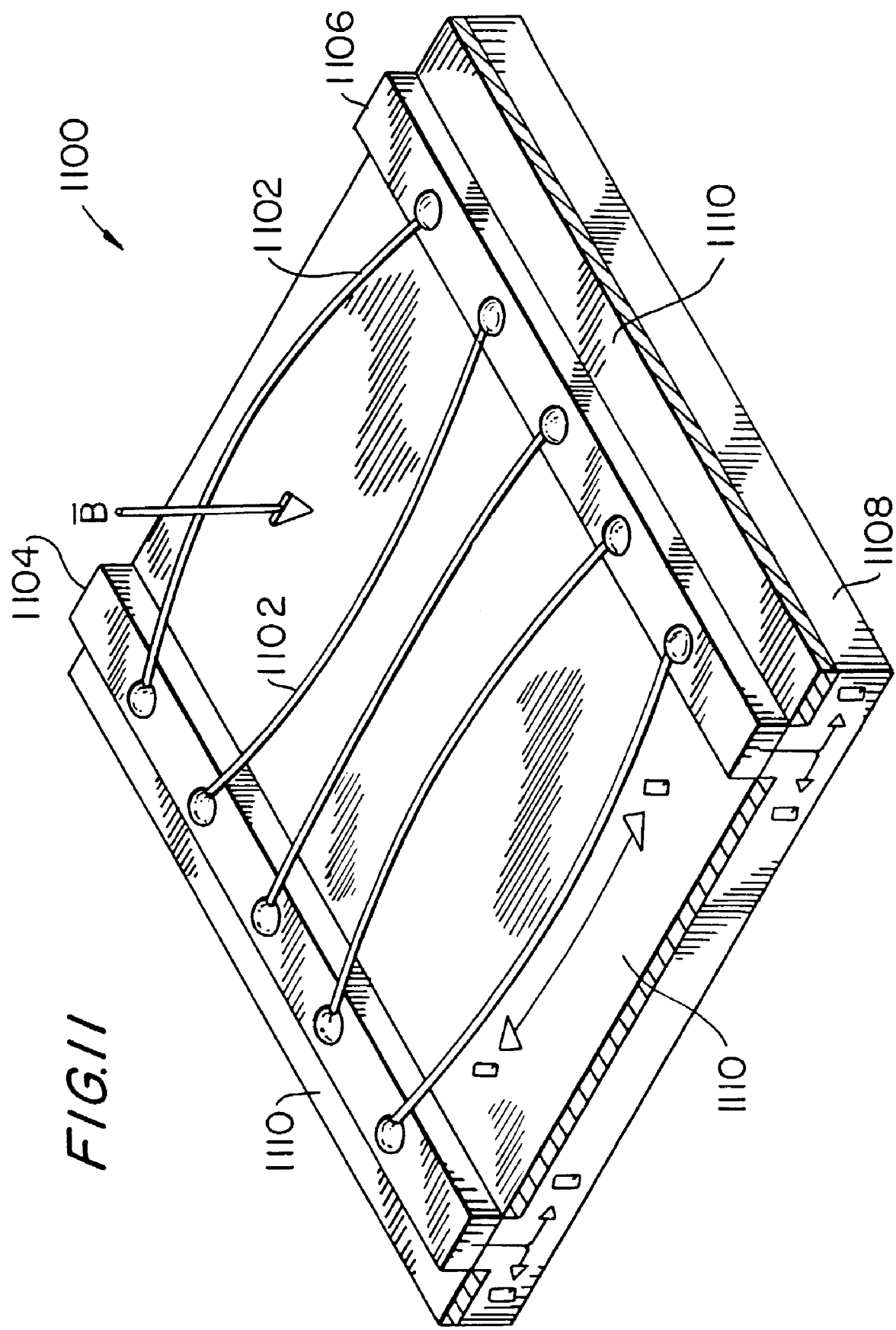
FIG. 11 is a perspective, partial cross-sectional view of another nanometer scale electromechanical system constructed in accordance with the principles of the present invention.

FIG. 11 shows a nanometer scale electromechanical assembly 1100 constructed in accordance with the principles of the present invention. Assembly 1100 includes a series of nanometer members 1102 that are connected between a pair of electrically and thermally conductive rails 1104 and 1106. In this embodiment, nanometer members 1102 are carbon nanotubes and each one of nanotubes 1102 is provided with some slack, which enables the nanotubes to vibrate in reaction to random pressure variations in the surrounding working substance. Rails 1104 and 1106 are mounted to and in thermal contact with thermally conductive base 1108.

It should be noted that various other nanometer members may be used in accordance with the present invention instead of the nanotubes described herein. For example, the principles of the present invention may be carried out using essentially any electrically conductive material that may be formed into very small fibers. This may include simple carbon fibers instead of nanotubes.

Figure 12:
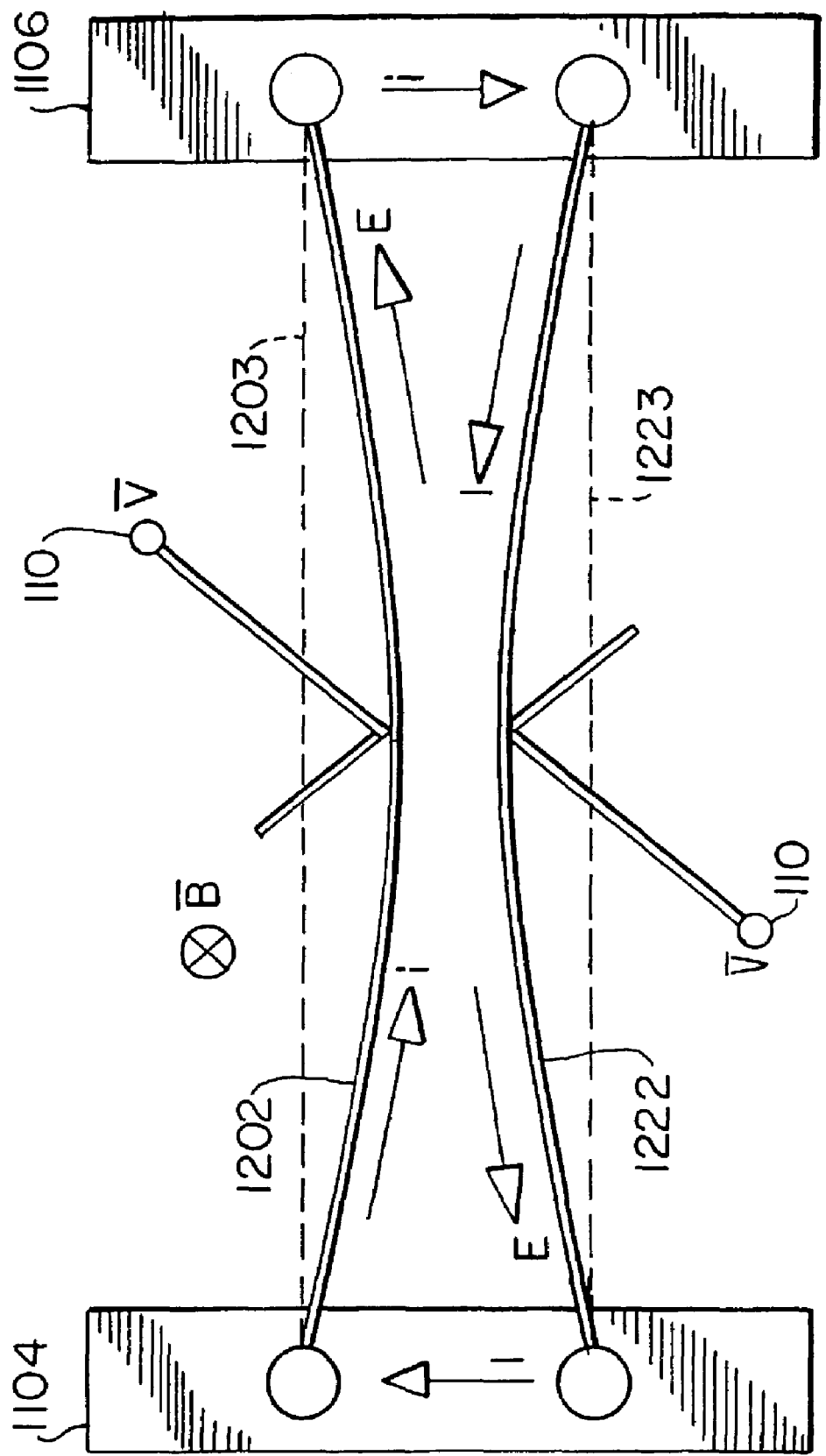
FIG. 12 is an illustrative schematic diagram of a portion of the nanometer scale electromechanical system of FIG. 11.
Figure 13:
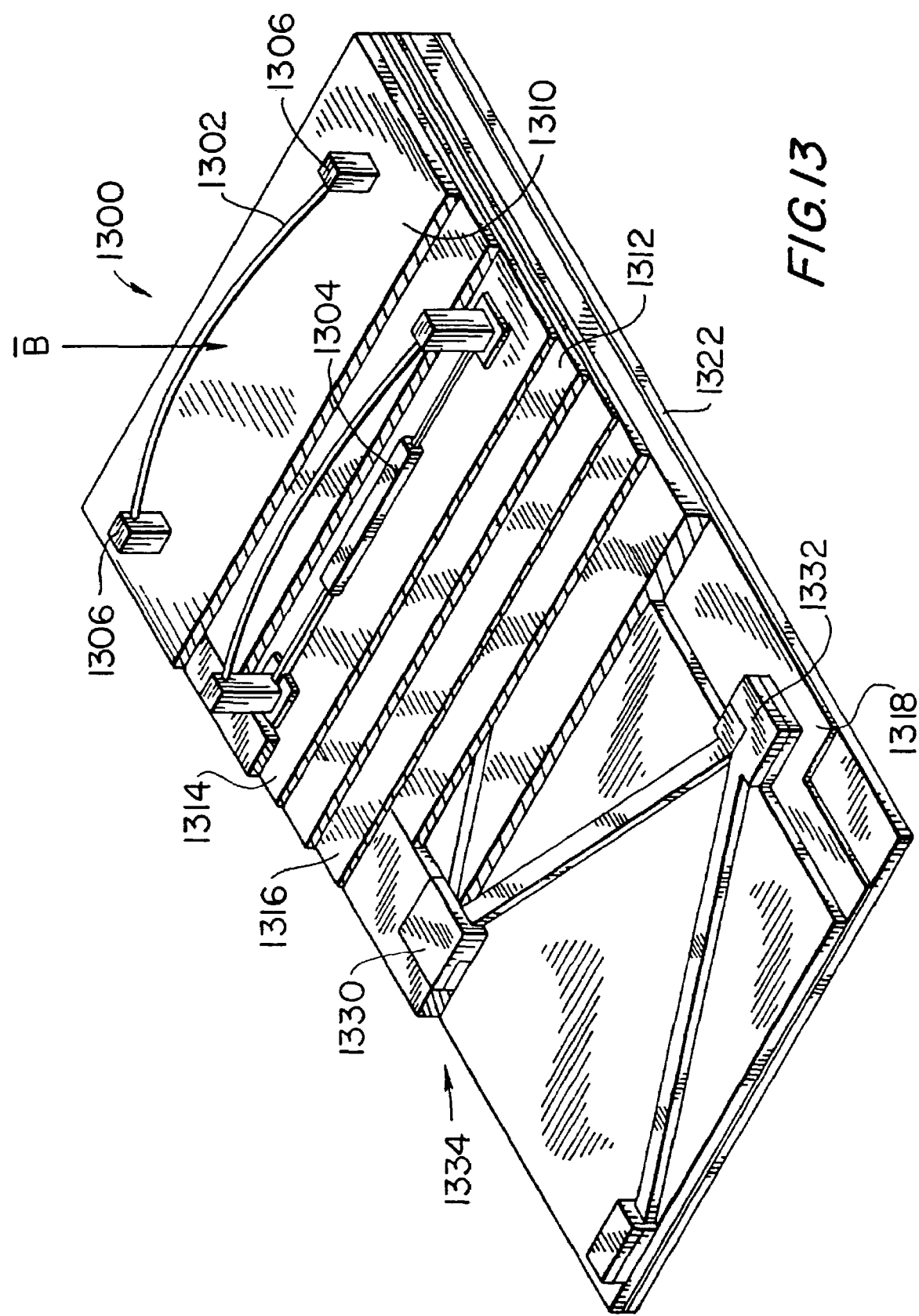
FIG. 13 is a perspective, partial cross-sectional view of another nanometer scale electromechanical system constructed in accordance with the principles of the present invention.
Figure 14:
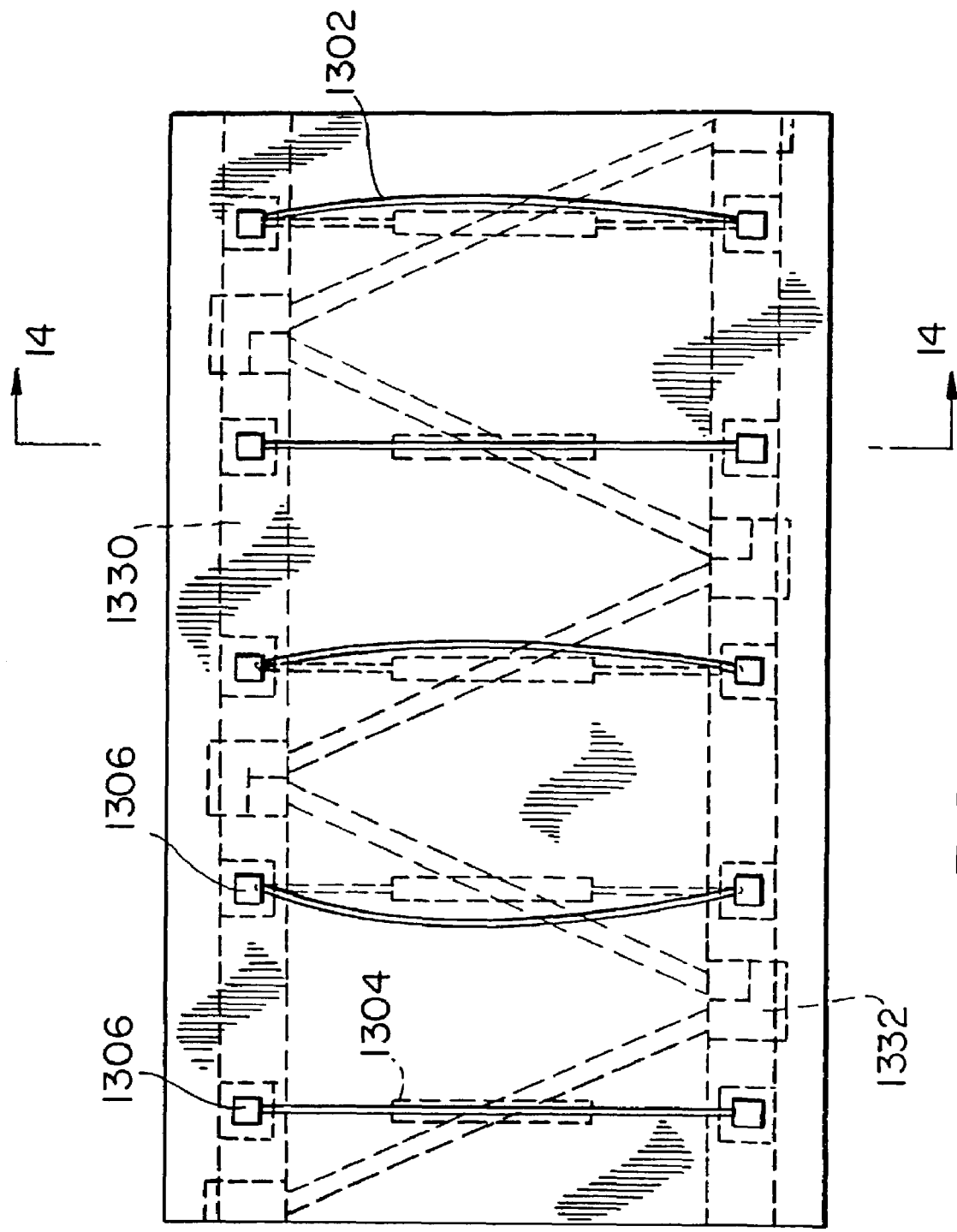
FIG. 14 is an illustrative schematic diagram of a portion of the nanometer scale electromechanical system of FIG. 13.

The nanometer members shown in FIGS. 11 and 12 (as well as those of FIGS. 13-16 discussed below) perform additional functions when compared to, for example, the previously described paddles. For example, the nanometer members of FIGS. 11-16 all function as the impact mass while contributing to the functions of the previously described restraining member and generator device. In addition, the nanometer members of FIGS. 11 and 12 also function as the resistive element (FIGS. 13-16 include resistive element 1304, as described more fully below).

Attached to thermally conductive base 1108, in accordance with the principles of the present invention, is a thermal insulation material 1110 that covers at least a majority of the otherwise exposed portions of conductive base 1108. The use of insulation 1110 aides in the prevention of thermal energy losses. Moreover, persons skilled in the art will appreciate that similar insulation may be utilized in the previously described embodiments to further increase the efficiency of those systems and assemblies.

An external magnetic field (shown as "$\overline{B}$" in FIG. 11) penetrates assembly 1100 which is perpendicular to rails 1104 and 1106 and base 1108. The operation of assembly 1100 is illustrated in FIG. 12, which shows a portion of rails 1104 and 1106, and includes two individual nanotubes 1202 and 1222 (which are simply two adjacent nanotubes 1102). Nanotubes 1202 and 1222, which are immersed in a working substance, move in an irregular manner from the relaxed "rest" position (shown as straight dotted lines 1203 and 1223) due to random variations in the thermal motion of the molecules of the working substance. Motion of nanotubes 1202 and 1222 in the presence of the magnetic field $\overline{\otimes)B}$ induces an electric field E along the length of nanotubes 1202 and 1222 (as shown in FIG. 12).

Field E induces current "i" to flow that flows from one nanotube, down one rail, across the other nanotube, and up the other rail (which, while illustrated as a clockwise current, may be counterclockwise at some other point in time when the direction of the motion of the nanotubes changes, thereby producing AC current). The current flow through the nanotubes and rails causes resistive heating and causes heat to travel along the nanotubes and rails to conductive base 1108. Fluid (either gas or liquid) surrounding the nanotubes cools while base 1108 heats up, thereby establishing a temperature differential that may be used in a variety of ways (such as the heat pump, or heat engine previously described).

FIGS. 13-16 show a further illustration of the use of insulation in accordance with the principles of the present invention in assembly 1300. Assembly 1300 is similar to assembly 1100 of FIG. 11 in many aspects. Assembly 1300 also includes nanotubes 1302 that are immersed in a working substance. Moreover, as described above with respect to nanotubes 1102, nanotubes 1302 are installed with slack such that they can move in an irregular manner due to random fluctuations in the thermal motion of the molecules of the working substance.

Assembly 1300 also relies on an external magnetic field $\overline{B}$. As previously described, motion of nanotubes 1302 through the magnetic field $\overline{B}$ induces an AC current to flow, which in this case, is directed through a resistor 1304 located directly below each of nanotubes 1302. The value of resistor 1304 may be chosen to be about twice the resistance of the nanotube, in which case the majority of power generated is dissipated as heat through the resistor.

Assembly 1300 is configured such that the resistors 1304 are located below insulating layer 1310 and above thermally conductive sheet 1312. This results in directing most of the generated power and heat downward into assembly 1300, rather than up into the working fluid. Moreover, rather than using rails, assembly 1300 utilizes posts 1306, so that only a limited amount of surface area that is at an elevated temperature is exposed to the working fluid. Resistors 1304, posts 1306 and the resistor leads are electrically insulated from thermally conductive sheet 1312 by a thin layer of electrical insulation 1314 that is deposited on top of conductive layer 1312.

Heat from resistor 1304 raises the temperature of thermally conductive sheet 1312. The bottom of conductive sheet 1312 is in thermal contact with a "HOT" portion 1330 of a thermoelectric generator 1334 (sheet 1312 is electrically insulated from hot portion 1330 via electrically insulating sheet 1316). A second thermally conductive sheet 1322 is in thermal contact with a "COLD" portion 1332 of a thermoelectric generator 1334 (while the two are electrically insulated by thin layer 1318). In this manner, generated heat is directed from resistors 1304 downward through assembly 1300 and out the bottom of lower layer 1322.

Temperature differentials between the HOT and COLD portions (1330 and 1332, respectively) of thermoelectric generator 1334 create a DC voltage across each junction. By interconnecting a multitude of these junctions together in series, assembly 1300 may be used to provide a useable voltage which may be about at least 1 volt, as was previously described for the other embodiments. When assembly 1300 is used to drive a load, such that the load is connected in series to thermoelectric generator 1334, and the working fluid is being cooled or maintained within a predetermined temperature range, improved efficiency of the system will be obtained by keeping the load away from the working fluid so that dissipated power in the load does not affect the temperature of the working fluid.

Figure 15:
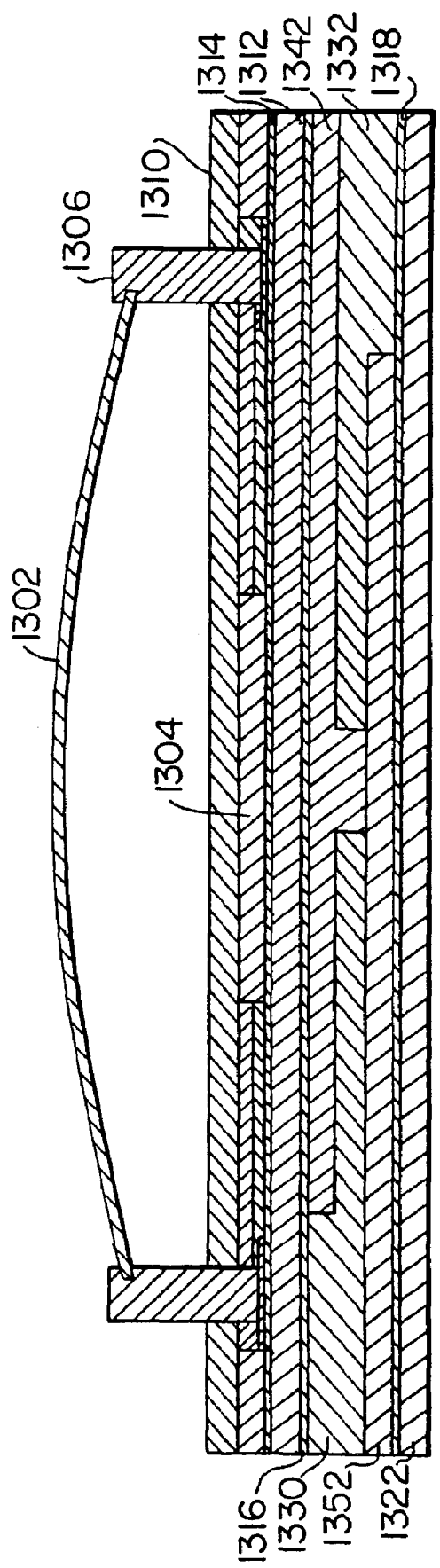
FIG. 15 is a cross-sectional plan view of the nanometer scale electromechanical system of FIG. 13 taken along line 14-14.

Moreover, as can be viewed most clearly in FIG. 15, additional layers of thermal insulation are used to separate the HOT portions of assembly 1300 from the COLD portions of assembly 1300. In particular, assembly 1300 also includes insulating layer 1342 sandwiched between conductive sheet 1312 (actually, as shown, layer 1342 is below electrical insulating layer 1316) and COLD portion 1332. Insulating layer 1352, on the other hand, is located between a second conductive sheet 1322 and HOT portion 1330 (actually, as shown, layer 1352 is underneath electrically insulating layer 1318). These insulating layers increase the temperature difference between HOT and COLD portions of thermoelectric generator, thus increasing the electrical output of thermoelectric generator 1334.

Figure 16:
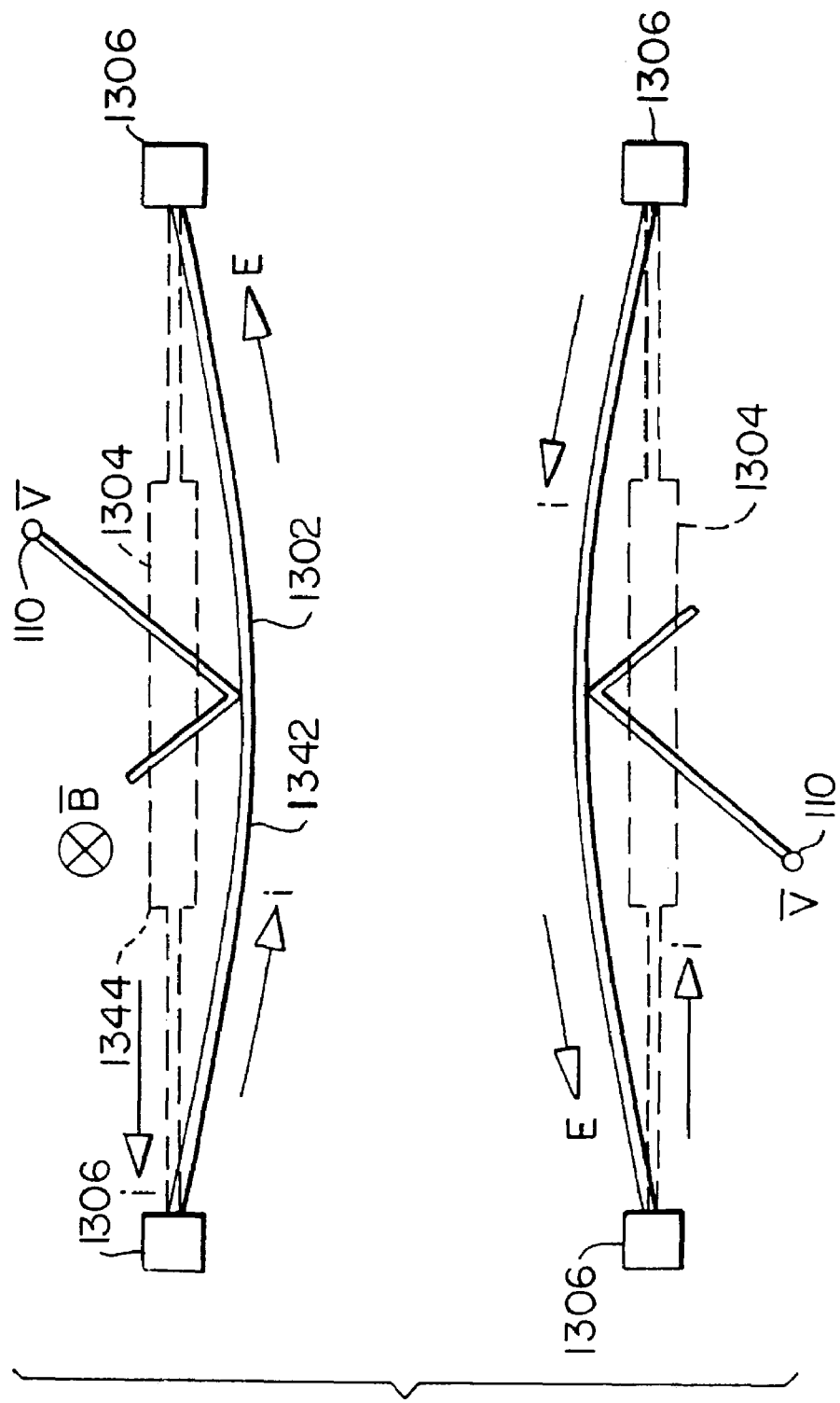
FIG. 16 is an illustrative schematic diagram of a portion of the nanometer scale electromechanical system of FIG. 13.

Operation of assembly 1300 is similar to assembly 1100, and is illustrated with respect to FIG. 16. Movement of nanotubes 1302 in the external magnetic field $\overline{\otimes)B}$ induces a current "i" to flow as shown in FIG. 16. In this case, though, the current from each individual nanotube 1302 remains in a self-contained circuit, along with the corresponding resistor 1304. For example, the current induced in individual nanotube 1342 remains in an "isolated" circuit with individual resistor 1344, rather than interacting with an adjacent nanotube, as was described with respect to assembly 1100. Once again, persons skilled in the art will appreciate that, while the movement of two nanotubes is shown, the movement of millions or billions of nanotubes would be occurring simultaneously.

Persons skilled in the art should appreciate that, while it may appear that an individual thermoelectric generator portion is available for each individual nanotube 1302, is will likely be impractical and or prohibitively expensive to implement such a configuration. Thus, it may be more likely that, in accordance with the present invention, several, if not millions, of nanotubes 1302 will be thermally coupled to each individual portion of thermoelectric generator 1334.

Figure 17:
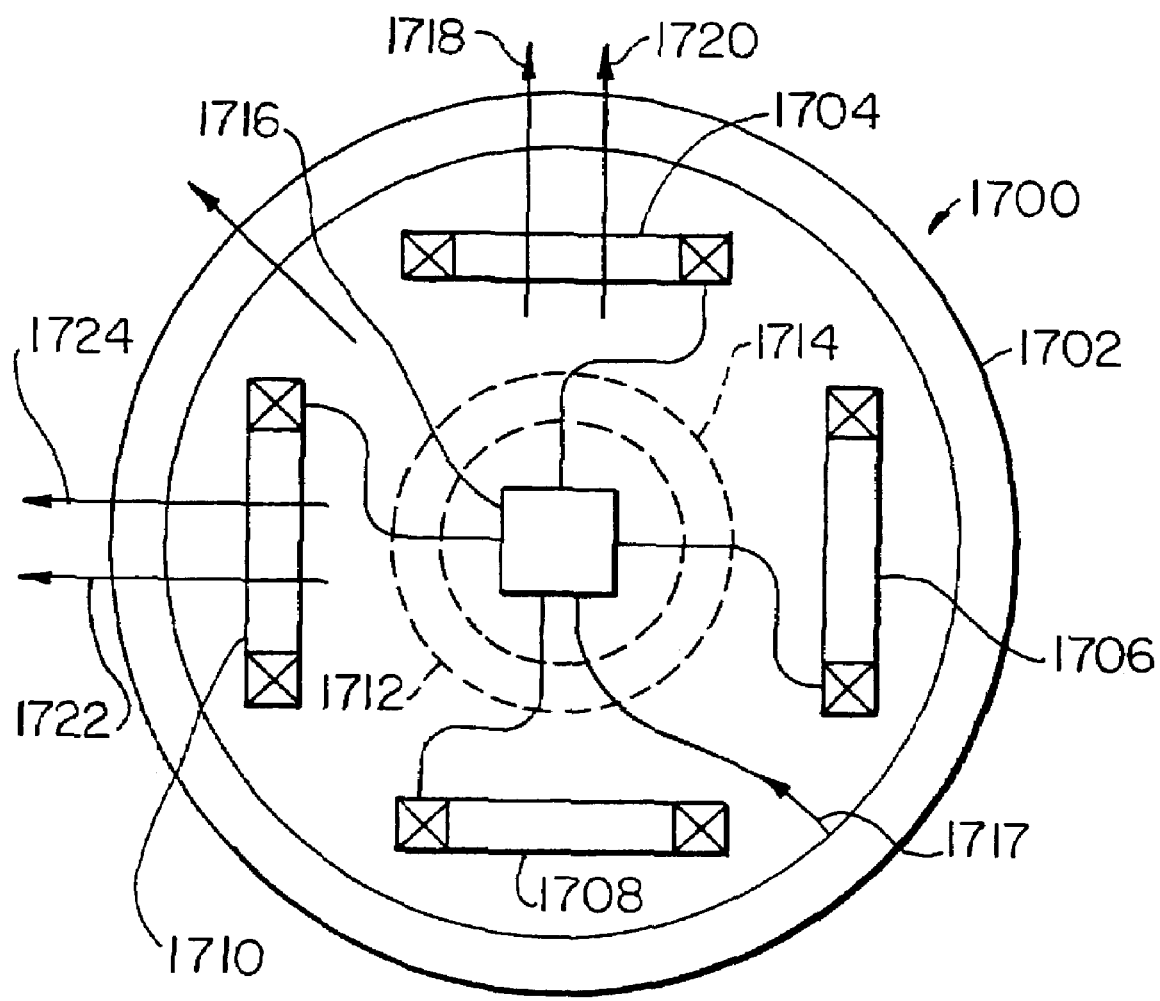
FIG. 17 is an illustrative schematic diagram of an electromechanical propulsion system constructed in accordance with the principles of the present invention.

FIG. 17 shows a propulsion system 1700 constructed in accordance with the present invention in which an object immersed in a working substance is moved in a controllable direction as a result of variations in molecular impacts of working substance molecules into the object. System 1700 includes sphere 1702 and a series of electromagnets 1704, 1706, 1708, 1710, 1712 and 1714 (1712 and 1714 are shown as a single pair of dotted lines) arranged axially about electronics core 1716 (axially simply refers to the fact that there is one electromagnet located parallel to each of the six sides of electronics core 1716, and that each electromagnet may have its center aligned with an imaginary axis extending perpendicular to the core surface). These electromagnets, along with a control system form a drive system that, as set forth in more detail below, helps to propel sphere 1702.

Sphere 1702 may be any three-dimensional object. Although a sphere is shown, other shapes such as a cube, cylinder, etc., may be used. The surface of sphere 1702 is covered with nanometer scale assemblies, such as a series of nanotubes, that are mounted to the surface with some slack, as described above with respect to FIGS. 11-16.

Electromagnets 1704, 1706, 1708, 1710, 1712 and 1714 may be powered from, for example, a battery or some other source. In any case, external power is provided to electronics core 1716 that is then provided to the appropriate electromagnets, as described below.

Assuming sphere 1702 is located in a fluid maintained at non-zero temperature, when one electromagnet is energized, such as electromagnet 1704, the resultant magnetic field 1718, along with the nanotube assembly, lowers the fluid pressure immediately above the surface. The reduced pressure causes sphere 1702 to move in direction 1720 (if the propulsion force is strong enough). If, for example, electromagnet 1710 is also energized, thereby establishing magnetic field 1722, a force 1724 also affects sphere 1702. In this instance, sphere 1702 would be propelled along a vector 45 degrees away from magnetic axes 1718 and 1722 (as shown by arrow 1726). By varying the current supplied to each of the electromagnets, the movement of sphere 1702 through a fluid can be controlled.

From the foregoing description, persons skilled in the art will recognize that this invention provides nanometer scale electromechanical assemblies and systems that may be used to convert one form of energy to another. These assemblies and systems may be used to provide, for example, heat engines, heat pumps or propulsion devices. In addition, persons skilled in the art will appreciate that the various configurations described herein may be combined without departing from the present invention. For example, the nanotubes shown in FIG. 4 may be mounted directly to piezoelectric generators of FIG. 4, instead of the configuration shown. It will also be recognized that the invention may take many forms other than those disclosed in this specification. Accordingly, it is emphasized that the invention is not limited to the disclosed methods, systems and apparatuses, but is intended to include variations to and modifications thereof which are within the spirit of the following claims.

I claim:

1. An assembly that converts energy from one form to another and is submersed in a working substance having a plurality of moving molecules, wherein said working substance is heated by a source of heat, said assembly comprising:
    a paddle that reduces the velocity of said molecules that impact said paddle;
    a generator device that is coupled to said paddle, wherein said generator device converts kinetic energy of said paddle into a different form of energy as a result of said paddle reducing the velocity of said molecules that impact said paddle;
    a resistor, wherein said generator device includes a pair of output leads coupled across said resistor; and
    a thermoelectric generator, wherein said resistor is coupled to one side of said thermoelectric generator.

2. The assembly of claim 1, said nanometer scale assembly further comprising:
    a base member; and
    wherein said generator device further comprises:
        a stationary portion that is coupled to said base member, said stationary portion being stationary with respect to said base member; and
        a non-stationary portion that is coupled to said paddle, said non-stationary portion that moves in response to the movement of said paddle.

3. The assembly of claim 1 wherein said generator device is a piezoelectric generator and said generator device includes a pair of output leads.

4. The assembly of claim 1 wherein said generator device comprises:
    a first conductive layer;
    a second conductive layer; and
    a piezoelectric layer coupled between said first and second conductive layers.

5. The assembly of claim 1 wherein motion of said paddle is substantially confined between a neutral point and a single limit point.

6. The assembly of claim 1 wherein said paddle includes a spring constant.

7. The assembly of claim 1 wherein said paddle includes a resting location relative to said base and said paddle is confined to movement either above or below said resting location.

8. The assembly of claim 1 wherein said generator device produces a pulsating DC output.

9. The assembly of claim 1 further comprising
    at least one heat sink coupled to said thermoelectric generator.

10. The assembly of claim 1 wherein a plurality of nanotubes are coupled to said paddle, each of said plurality of nanotubes including a longitudal axis, said plurality of longitudal axis being parallel to each other, and said plurality of longitudal axis being substantially perpendicular to said paddle.

11. The assembly of claim 1 wherein said working substance is kept at an elevated pressure.

12. The assembly of claim 1 wherein said working substance is kept at atmospheric pressure.

13. A nanometer scale assembly that converts energy and is submersed in a working substance having a plurality of moving molecules, wherein said working substance is heated by a source of heat, said nanometer scale assembly comprising:
    a base member; and
    a piezoelectric generator device, wherein a stationary portion of said piezoelectric device is coupled to said base member, said stationary portion is stationary with respect to said base member, a non-stationary portion that is operable to move with respect to said stationary portion, and kinetic energy of said piezoelectric generator device is created by the reduction of velocity of said molecules and converted to a voltage differential when said non-stationary portion of said piezoelectric device moves with respect to said stationary portion of said piezoelectric device, and said piezoelectric generator device is operable to produce an output voltage of a one polarity and is not operable to produce said output voltage at the other polarity.

14. The nanometer scale assembly of claim 13 wherein said piezoelectric generator device comprises:
    a first conductive layer;
    a second conductive layer; and
    a piezoelectric layer coupled between said first and second conductive layers.

15. The nanometer scale assembly of claim 14 wherein said piezoelectric generator device converts kinetic energy of said piezoelectric layer into a voltage differential across said first and second conductive layers.

16. The nanometer scale assembly of claim 13 further comprising a resistor, wherein said generator device includes a pair of output leads coupled across said resistor.

17. The nanometer scale assembly of claim 13 wherein a plurality of nanotubes are coupled to said piezoelectric generator.

18. The nanometer assembly of claim 13 wherein said working substance is kept at an elevated pressure.

19. The nanometer assembly of claim 13 wherein said working substance is kept at atmospheric pressure.

20. The assembly of claim 13, wherein said output voltage is a DC voltage.

21. An energy conversion system that is immersed in a working substance having a plurality of moving molecules, wherein said working substance is heated by a source of heat, said system comprising:

a base member;

a plurality of nanometer scale assemblies coupled to said base member, each of said nanometer scale assemblies comprising:

a paddle that reduces the velocity of said molecules that impact said paddle, wherein said paddle includes a spring constant and the movement in one direction of said paddle is limited by an object; and a piezoelectric generator device that is coupled to said paddle, wherein said generator is configured to convert kinetic energy of said paddle into a DC voltage as a result of said paddle reducing the velocity of said molecules that impact said paddle, and wherein said generator is operable to produce said DC voltage at one polarity and is not operable to produce said DC voltage at the other polarity.

22. The energy conversion system of claim 21 wherein said working substance is kept at an elevated pressure.

23. The energy conversion system of claim 21 wherein said working substance is kept at atmospheric pressure.

24. An assembly that converts energy from one form to another and is submersed in a working substance having a plurality of moving molecules, wherein said working substance is heated by a source of heat, said assembly comprising:

a nanometer-scale generator device, wherein said generator device converts kinetic energy of said molecules into a different form of energy as a result of said generator reducing the velocity of said molecules, wherein said generator is operable to produce a DC output of one polarity and is not operable to produce said DC output at the other polarity.

25. The assembly of claim 24, wherein said generator device has a pair of output leads.

26. The assembly of claim 24, wherein said working substance is heated by a source of heat.

27. The assembly of claim 24, wherein said generator device is a piezoelectric generator device.

28. The assembly of claim 24, wherein said working substance is kept at an elevated pressure.

29. The assembly of claim 24, wherein said working substance is kept at atmospheric pressure.

* * * * *